(12) United States Patent
Zaitsu et al.

(10) Patent No.: US 9,355,740 B2
(45) Date of Patent: May 31, 2016

(54) SEMICONDUCTOR NONVOLATILE MEMORY DEVICE WITH ONE-TIME PROGRAMMABLE MEMORIES

(71) Applicant: KABUSHIKI KAISHA TOSHIBA, Tokyo (JP)

(72) Inventors: Koichiro Zaitsu, Kanagawa (JP); Kosuke Tatsumura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/491,074

(22) Filed: Sep. 19, 2014

(65) Prior Publication Data

US 2015/0262624 A1    Sep. 17, 2015

(30) Foreign Application Priority Data

Mar. 12, 2014  (JP) ................. 2014-049278

(51) Int. Cl.
G11C 16/04    (2006.01)
G11C 17/18    (2006.01)
G11C 5/06     (2006.01)
G11C 17/14    (2006.01)

(52) U.S. Cl.
CPC ............ *G11C 17/18* (2013.01); *G11C 5/063* (2013.01); *G11C 17/146* (2013.01)

(58) Field of Classification Search
USPC ...................... 365/185.17, 185.27, 185.28
See application file for complete search history.

(56) References Cited

U.S. PATENT DOCUMENTS

| | | | |
|---|---|---|---|
| 6,888,750 B2 | 5/2005 | Walker et al. | |
| 7,852,656 B2 | 12/2010 | Shin et al. | |
| 8,305,790 B2 | 11/2012 | Chung et al. | |
| 2009/0140316 A1* | 6/2009 | Sugihara | G11C 16/0483 257/316 |
| 2011/0044107 A1 | 2/2011 | Wada | |
| 2011/0096609 A1* | 4/2011 | Lee | G11C 16/0425 365/185.28 |
| 2014/0061765 A1 | 3/2014 | Zaitsu et al. | |
| 2014/0192594 A1* | 7/2014 | Lue | G11C 16/10 365/185.11 |
| 2015/0117104 A1* | 4/2015 | Senoo | G11C 16/0483 365/185.12 |

FOREIGN PATENT DOCUMENTS

| | | |
|---|---|---|
| JP | 2002-164513 | 6/2002 |
| JP | 2011-44602 | 3/2011 |
| JP | 2014-53374 | 3/2014 |

OTHER PUBLICATIONS

Koichiro Zaitsu et al., "Standard CMOS Base One-time Programmable Switches with Gate-Induced Permanent Source-Drain Path", *Extended Abstracts of the 2013 International Conference on Solid State Devices and Materials*, Fukuoka, 2013, pp. 698-699.

* cited by examiner

*Primary Examiner* — Hoai V Ho
(74) *Attorney, Agent, or Firm* — Finnegan, Henderson, Farabow, Garrett & Dunner LLP

(57) ABSTRACT

A semiconductor nonvolatile memory device of an embodiment includes: a plurality of transistors arranged in a matrix, the transistors in the same row being connected in series to form a transistor string having a first terminal and a second terminal; a plurality of first wiring lines each corresponding to one of the columns, and being connected to the gates of the transistors of the corresponding column; a common first electrode connected to each semiconductor region in which each transistor is disposed; and a write unit that selects one of the first wiring lines and one of the transistor strings, and applies a first voltage to the first electrode, a first write voltage to the selected first wiring line, a second voltage to the other first wiring lines, and a second write voltage to the first terminal and the second terminal of the selected transistor string in a write operation.

19 Claims, 12 Drawing Sheets

SEMICONDUCTOR NONVOLATILE MEMORY DEVICE WITH ONE-TIME PROGRAMMABLE MEMORIES

CROSS REFERENCE TO RELATED APPLICATIONS

This application is based upon and claims the benefit of priority from prior Japanese Patent Application No. 2014-049278 filed on Mar. 12, 2014 in Japan, the entire contents of which are incorporated herein by reference.

FIELD

Embodiments described herein relate generally to semiconductor nonvolatile memory devices.

BACKGROUND

One-time programmable memories are memory elements capable of writing data only once, which can be categorized into fuse type or anti-fuse type. Conventional one-time programmable memories, regardless of whether they are of fuse type or anti-fuse type, have two terminals for applying a voltage or causing a current to flow. In the initial state, the resistance between the two terminals of a one-time programmable memory of fuse type is low. If a predetermined voltage is applied or a predetermined current is caused to flow between the two terminals, the resistance becomes high. In contrast, in the initial state, the resistance between the two terminals of a one-time programmable memory of anti-fuse type is high, and if a predetermined voltage is applied or a predetermined current is caused to flow between the two terminals, the resistance becomes low.

The anti-fuse type one-time programmable memories typically include MOS transistors, in which the source, the drain, and the well are short-circuited. A predetermined voltage is applied between the short-circuited terminals and the gate to cause a breakdown of a gate insulating film, thereby changing the resistance between the terminals to be low.

One-time programmable memories of this type are well known, but have the following problem. The number of terminals to which a voltage can be independently applied is only two, the gate and the terminal obtained by short-circuiting the source, the drain, and the well. For this reason, if one-time programmable memories are arranged in a column direction and a row direction to form an array, it may be difficult to write data only to a selected memory. In order to prevent erroneous writing to unselected one-time programmable memories, one or more selectors (for example, transistors or diodes) are needed for each one-time programmable memory. As the number of memory elements increases, the number of selectors also increases. This expands the area of the entire chip.

DETAILED DESCRIPTION

Figure 1:
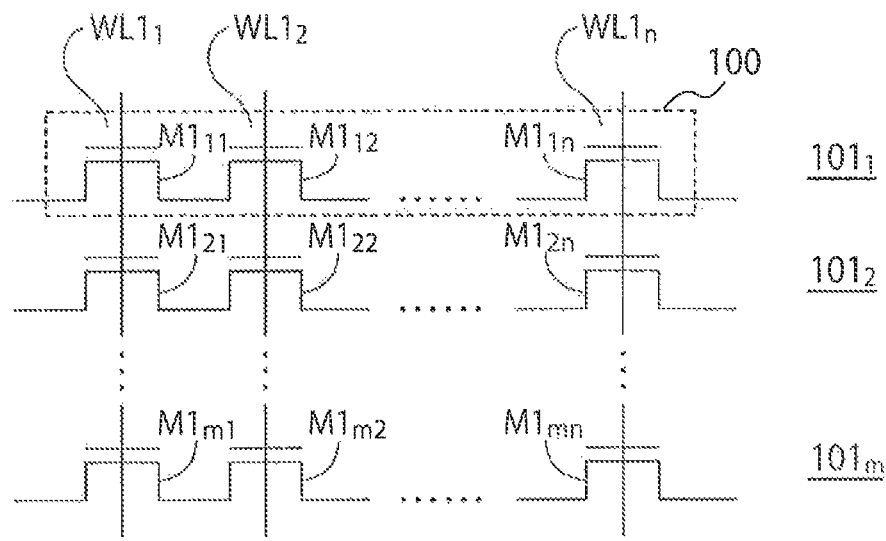
FIG. 1 is a diagram showing a semiconductor nonvolatile memory device according to a first embodiment.

A semiconductor nonvolatile memory device according to an embodiment includes: a plurality of transistors arranged in rows and columns to form a matrix, each transistor including a source region and a drain region separately disposed in a semiconductor region, and a gate disposed on the semiconductor region in a channel region between the source region and the drain region, the transistors in the same row being connected in series to form a transistor string having a first terminal and a second terminal; a plurality of first wiring lines each corresponding to one of the columns, and being connected to the gates of the transistors of the corresponding column; a common first electrode connected to each semiconductor region in which each transistor is disposed; and a write unit that selects one of the first wiring lines and one of the transistor strings, and applies a first voltage to the first electrode, a first write voltage to the selected first wiring line, a second voltage to the other first wiring lines, and a second write voltage to the first terminal and the second terminal of the selected transistor string in a write operation, the first voltage being between the first write voltage and the second write voltage, and the second write voltage being between the first voltage and the second voltage.

Embodiments will now be explained with reference to the accompanying drawings.

First Embodiment

A semiconductor nonvolatile memory device according to a first embodiment will be described with reference to FIG. 1. The semiconductor nonvolatile memory device according to the first embodiment includes a memory cell array 100 including m (>1) transistor strings $101_1$-$101_m$, each transistor string $101_i$ ($1 \le i \le m$) including n (n>1) transistors $M1_{i1}$-$M1_{in}$ connected in series. In other words, the memory cell array 100 includes m×n transistors $M1_{11}$-$M1_{mn}$ (m, n>1) arranged in a matrix form, in which n transistors $M1_{i1}$-$M1_{in}$ in the same row (i ($1 \leq i \leq m$)) are connected in series. Each transistor $M1_{ij}$ (i=1, ..., m, j=1, n) forms a memory cell.

Gates of the m transistors $M1_{1j}$-$M1_{mj}$ in the same column (j ($1 \leq j \leq n$)) are connected to the same word line $WL1_j$. Specifically, the gate of a transistor, for example the transistor $M1_{11}$, of a transistor string, for example the transistor string $101_1$, is connected to the word line $WL1_1$, to which the gates of the transistors $M1_{21}$-$M1_{m1}$ in the same column in other transistor strings $101_2$-$101_m$ are connected. Wells on which the transistors $M1_{11}$, ..., $M1_{mn}$ are formed are connected to a common well electrode SUB1, although this is not shown in FIG. 1. The transistors $M1_{11}$, ..., $M1_{mn}$ here are n-channel MOS transistors.

(Write Method)

A write method for selectively writing data to a specific one of the memory cells, i.e., a transistor, in the memory cell array 100 of the semiconductor nonvolatile memory device according to the first embodiment shown in FIG. 1 will be described below. FIG. 2 shows an example of voltage conditions for writing data to the transistor $M1_{12}$. First, the well electrode SUB1 is set at a ground voltage. A first write voltage (for example, −10 V), which is lower than the voltage of the well electrode SUB1, is applied to the word line $WL1_2$, to which the gate of the transistor $M1_{12}$ is connected. A second write voltage (for example, 2 V), which is higher than the voltage of the well electrode SUB1, is applied to the source of the transistor $M1_{11}$ and the drain of the transistor $M1_{1n}$.

A pass voltage (for example, 5 V), which is higher than the second write voltage, is applied to the word lines $WL1_1$, $WL1_3$, ..., $WL1_n$ other than the word line $WL1_2$. A voltage that is the same as the voltage of the well electrode SUB1 is applied to the sources of the transistors $M1_{21}$, ..., $M1_{m1}$ and the drains of the transistors $M1_{2n}$, ..., $M1_{mn}$.

Under the aforementioned voltage conditions, all of the transistors, the gate of which are connected to the word lines $WL1_1$, $WL1_3$, ..., $WL1_n$, are turned on. As a result, the voltage applied to the source and the drain of the transistor $M1_{12}$ is same as the second write voltage. The potential difference between the gate and the source of the transistor $M1_{12}$ then becomes same as the potential difference between the first write voltage (for example −10 V) and the second write voltage (for example 2 V) (12V in FIG. 2). In this state, a considerable number of carriers are generated by band-to-band tunneling in a diffusion layer of the source of the transistor $M1_{12}$, if the potential difference between the gate and the source is sufficiently large, the carriers are generated intensively. As a result, the PN junction at the boundary between the source and the substrate is partially broken by the energy of the considerable number of carriers generated in the diffusion layer. Similarly, if the potential difference between the gate and the drain of the transistor $M1_{12}$ is sufficiently large, the PN junction at the boundary between the drain and the substrate is partially broken. The transistor in which the PN junctions are broken in both the source and the drain has a considerably reduced electric resistance between the source and the drain, and is kept in the ON state regardless of the value of the gate voltage.

According to the aforementioned method, data can be selectively written to the transistor $M1_{12}$ shown in FIG. 2. After the data is written, the resistance between the source and the drain of the transistor $M1_{12}$ becomes low regardless of the value of the gate voltage.

Next, the states of transistors other than the transistor $M1_{12}$ will be studied. The voltage applied to the gates of the transistors $M1_{22}$, ..., $M1_{m2}$ in the same columns as the transistor $M1_{12}$ is the first write voltage (for example, −10 V). The voltage applied to the sources and the drains of these transistors is the ground voltage. Thus, the potential difference between the gate and the source (for example, −10 V) and the potential difference between the gate and the drain (for example, −10 V) of each transistor do not reach a value to cause the breakdown of the PN junction. Therefore, no data is written thereto.

The potential difference between the gate and the source and the potential difference between the gate and the drain of each transistor, the gate being connected to any of the word lines $WL1_1$, $WL1_3$, ..., $WL1_n$, do not reach a sufficient value, for example 5 V or 3 V in the case shown in FIG. 2, and no data is written thereto.

The case where data is written to the transistor $M1_{12}$ has been described. The method is the same if data is written to other transistors; a first write voltage is applied to the word line to which the gate of the selected transistor is connected, a pass voltage is applied to the other word lines, a second write voltage is applied to the source (or drain) of transistors at both the ends of the transistor string including the selected transistor, and a ground voltage is applied to the sources (or drains) of the transistors at both the ends of the other transistor strings. Such an operation enables data to be written to the selected transistor efficiently.

In the first embodiment, the following relationship is met:
first write voltage<well electrode voltage<second write voltage<pass voltage.

In a known NAND flash memory, a voltage same as the well electrode voltage is applied across the selected transistor string, and a voltage (write inhibit voltage), which is higher than the well electrode voltage, is applied across the unselected transistor strings. If the above method used for the NAND flash memory is employed in the write method according to the first embodiment, a voltage same as the well electrode voltage may be applied across the selected transistor string, and a write inhibit voltage may be applied across the unselected transistor strings. In this case, however, the write inhibit voltage is lower than the well electrode voltage. As a result, the write inhibit voltage may be conveyed to the substrate from the source or drain of a transistor of the unselected transistor strings, and may not be correctly conveyed. Accordingly, it may be possible that data may be written to a transistor of an unselected transistor string in the same column as the selected transistor. In the first embodiment, however, since the second write voltage applied across the selected transistor string is higher than the well electrode voltage, the write inhibit voltage to be applied across the unselected transistor strings can be set at the same value as the well electrode voltage. This means that no voltage that is lower than the well electrode voltage is applied across the unselected transistor strings. Writing data to transistors of unselected transistor strings in the same column as the selected transistor can be prevented in this manner.

The transistor to which data is written by the aforementioned write method does not return to the high-resistance state. Thus, the transistor becomes a one-time programmable memory device.

Figure 15:
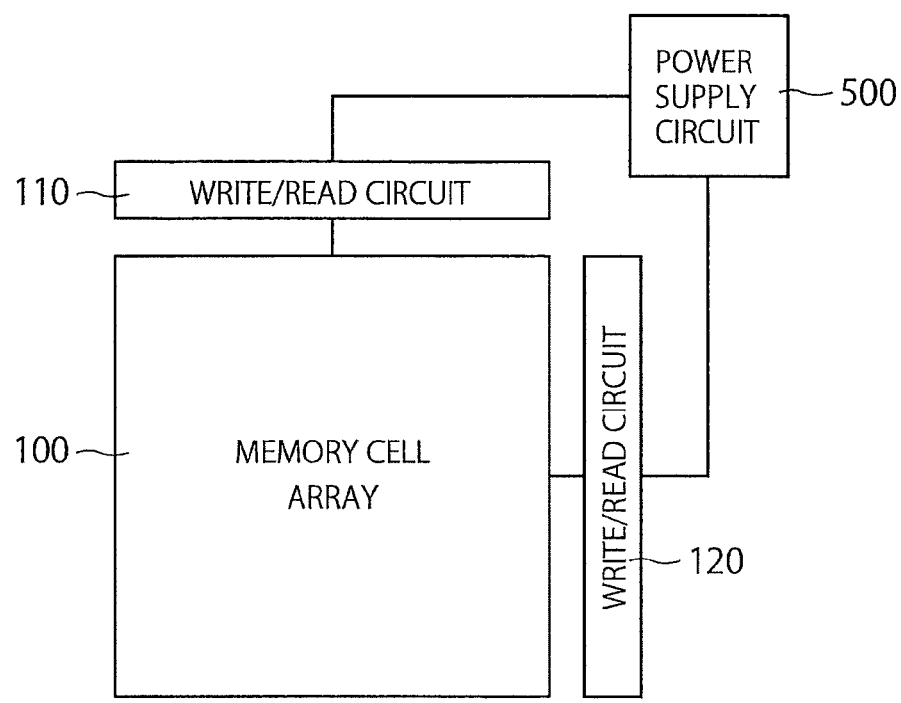
FIG. 15 is a block diagram showing a write/read unit used in the first, the third, and the fifth embodiments.

Such a write operation can be performed by, for example, a write/read unit shown in FIG. 15. The write/read unit includes a first write/read circuit 110 and a second write/read circuit 120. In a write operation, the first write/read circuit 110 applies a voltage to the wiring lines in the column direction of the memory cell array 100, i.e., the word lines $WL1_1$-$WL1_n$, using the voltage supplied from a power supply circuit 500. The second write/read circuit 120 applies a voltage to two terminals of each of the wiring lines in the row direction of the memory cell array 100, i.e., the transistor strings $101_1$-$101_m$, using a voltage supplied from the power supply circuit 500 in a write operation. A voltage from the power supply circuit 500 may be applied to the well electrode SUB1 by a third write circuit, or the well electrode SUB1 may be directly connected to a terminal for supplying a voltage from the power supply circuit 500 or a voltage application terminal provided near a chip side, although such features are not shown in FIG. 15. The power supply circuit 500 includes a plurality of power supplies for supplying voltages of different levels.

(Read Method)

Figure 2:
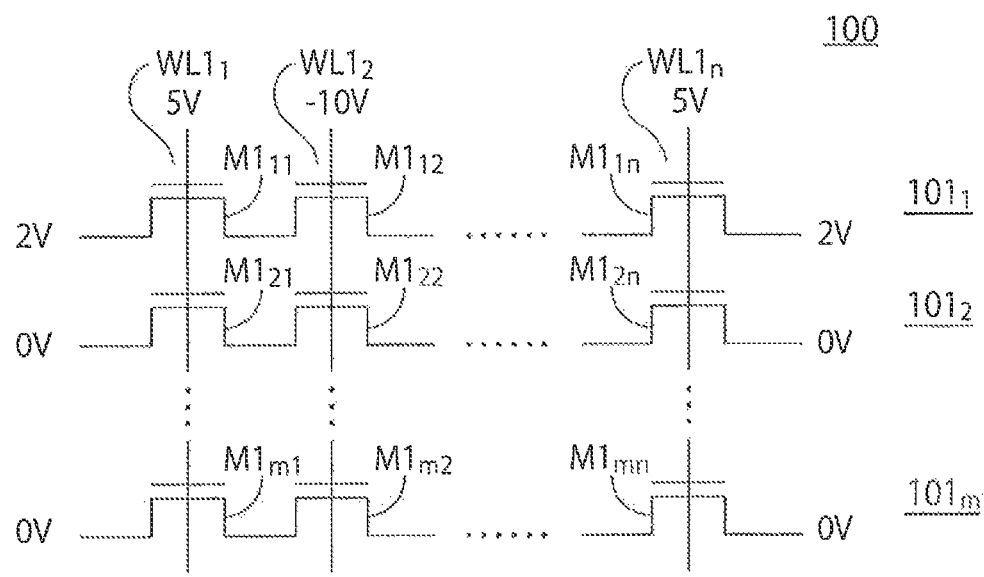
FIG. 2 is an explanatory diagram illustrating a writing method of the semiconductor nonvolatile memory device according to the first embodiment.

In order to select a specific transistor in the cell array 100 shown in FIG. 1 and read data from the selected transistor, a first read voltage (for example, 0 V) is applied to the word line, for example the word line $WL1_2$, to which the gate of the selected transistor, for example the transistor $M1_{22}$, is connected, a pass voltage (for example, 5 V) is applied to the other word lines $WL1_1, WL1_3, \ldots, WL1_n$, a ground voltage is applied to the source (or drain) of one of the transistors $M1_{21}, M1_{2n}$ located at the ends of the transistor string $101_2$ including the selected transistor $M1_{22}$, and a second read voltage (for example 1 V) is applied to the drain (or source) of the other of the transistors $M1_{21}, M1_{2n}$. Whether data is written to the selected transistor is determined depending on the magnitude of the current flowing through the source (or drain) of the transistors at the ends of the transistor string. Specifically, in a read operation, the selected transistor is in the OFF state, and the other transistors in the same transistor string as the selected transistor are in the ON state. Therefore, if data is written to the selected transistor, the current flowing through the source or drain of the transistors at the ends of the transistor string becomes high. If no data is written to the selected transistor, substantially no current flows through the source or drain of the transistors at the ends of the transistor string.

Such a read operation can be performed by, for example, the write/read unit shown in FIG. 15. In a read operation, the first write/read circuit 110 applies a voltage to the wiring lines in the column direction of the memory cell array 100, i.e., the word line $WL1_1$-$WL1_n$, using the voltage supplied from the power supply circuit 500. The second write/read circuit 120 applies a voltage to two terminals of each of the wiring lines in the row direction of the memory cell array 100, i.e., the transistor strings $101_1$-$101_m$, using the voltage supplied from the power supply circuit 500 in a read operation.

As described above, each memory cell of the first embodiment includes a single transistor, and no selector is needed. Accordingly, if the capacity increases, the increase in chip area can be suppressed.

Second Embodiment

Figure 3:
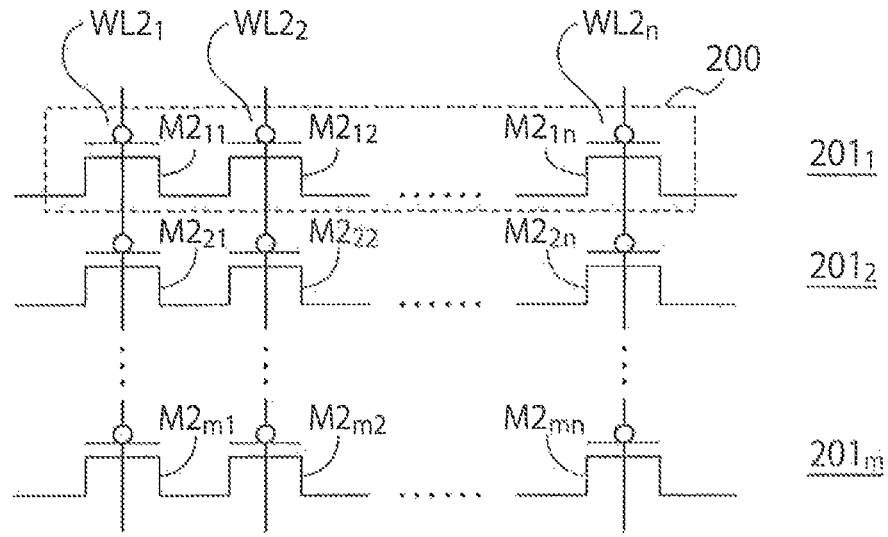
FIG. 3 is a diagram showing a semiconductor nonvolatile memory device according to a second embodiment.

A semiconductor nonvolatile memory device according to a second embodiment will be described with reference to FIGS. 3 and 4. FIG. 3 shows a configuration of a memory cell array 200 of the semiconductor nonvolatile memory device according to the second embodiment. The semiconductor nonvolatile memory device of the second embodiment is obtained by replacing the n-channel MOS transistors $M1_{ij}$ ($i=1, \ldots, m, j=1, \ldots, n$) constituting the respective memory cells of the semiconductor nonvolatile memory device according to the first embodiment shown in FIG. 1 with p-channel MOS transistors $M2_{ij}$ ($i=1, \ldots, m, j=1, \ldots, n$).

Specifically, the memory cell array 200 of the semiconductor nonvolatile memory device according to the second embodiment includes m (>1) transistor strings $201_1$-$201_m$, each transistor string $201_i$ ($1 \leq i \leq m$) including n (n>1) transistors $M2_{i1}$-$M2_{in}$ connected in series. Thus, the memory cell array 200 includes mxn transistors $M2_{11}$-$M2_{mn}$ (m, n>1) arranged in a matrix form, the n transistors $M2_{i1}$-$M2_{in}$ arranged in the same row (i ($1 \leq i \leq m$)) being connected in series, Each transistor $M2_{ij}$ ($i=1, \ldots, m, j=1, \ldots, n$) forms a memory cell.

The gates of the m transistors $M2_{1j}$-$M2_{mj}$ arranged in the same column (j ($1 \leq j \leq n$)) are connected to the same word line $WL2_j$. Thus, the gate of a transistor, for example the transistor $M2_{11}$, included in a transistor string, for example the transistor string $201_1$, is connected to the word line $WL2_1$ to which the gates of the transistors $M2_{21}$-$M2_{m1}$ in the same column as the transistor $M2_{11}$ but included in the other transistor strings $201_2$-$201_m$ are connected. The wells on which the transistors $M2_{11}, \ldots, M2_{mn}$ are formed are connected to the common well electrode SUB2, although this feature is not shown in FIG. 3.

(Write Method)

A method of selectively writing data to a specific one of the transistors in the semiconductor nonvolatile memory device according to the second embodiment shown in FIG. 3 will be described below. FIG. 4 shows an example of voltage conditions for writing data to the transistor $M2_{12}$.

First, a first voltage (for example 5 V) is applied to the well electrode SUB2. A first write voltage (for example, 15 V), which is higher than the first voltage applied to the well electrode SUB2, is applied to the word line $WL2_2$, to which the gate of the transistor $M2_{12}$ is connected. A second write voltage (for example, 3 V), which is lower than the first voltage applied to the well electrode SUB2 is applied to the source of the transistor $M2_{11}$ and the drain of the transistor $M2_{1n}$.

A pass voltage (for example, 0 V), which is lower than the second write voltage, is applied to the other word lines $WL2_1, WL2_3, \ldots, WL2_n$. A voltage same as the first voltage applied to the well electrode SUB2 is applied to the sources of the transistors $M2_{21}, \ldots, M2_{m1}$ and the drains of the transistors $M2_{2n}, \ldots, M2_{mn}$.

Figure 4:
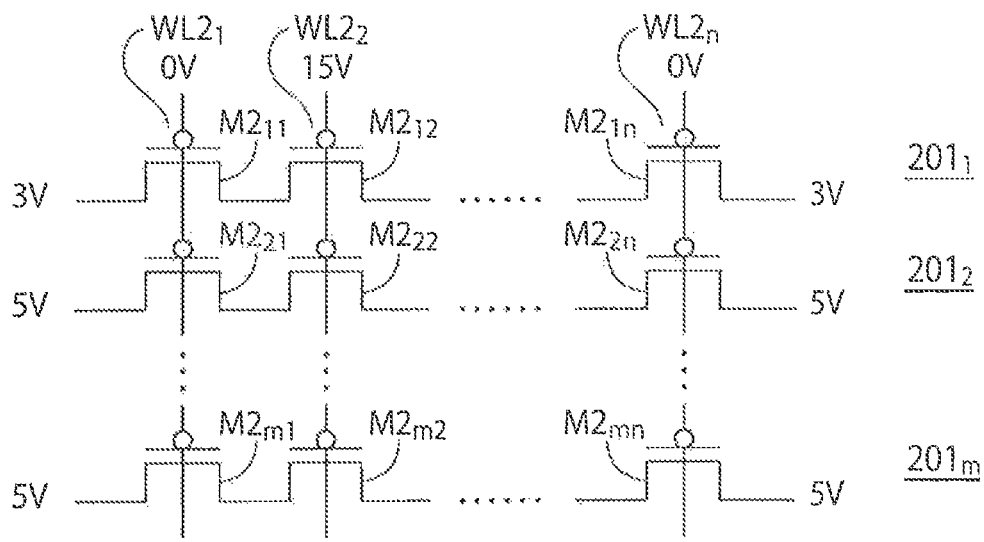
FIG. 4 is an explanatory diagram illustrating a writing method of the semiconductor nonvolatile memory device according to the second embodiment.

According to the aforementioned method, data can be selectively written to the transistor $M2_{12}$ shown in FIG. 4, in which the resistance between the source and the drain after the data is written becomes low regardless of the value of the gate voltage.

Although a case where data is written to the transistor $M2_{12}$ has been described, the same method is performed on the other transistors; a first voltage (for example 5 V) is applied to the well electrode SUB2, a first write voltage (for example 15 V) is applied to the word line to which the gate of the selected transistor is connected, a pass voltage (for example 0 V) is applied to the other word lines, a second write voltage (for example 3 V) is applied to the source (or drain) of each of the transistors at the ends of the transistor string including the selected transistor, and the first voltage (for example, 5 V) is applied to the sources (or drains) of the transistors at the ends of the other transistor strings. An efficient writing operation can be performed on an arbitrary transistor in this manner.

In the second embodiment, the following relationship is met:

first write voltage>well electrode voltage>second write voltage>pass voltage.

In a known NAND flash memory, a voltage same as the well electrode voltage is applied across the selected transistor string, and a voltage (write inhibit voltage), which is lower than the well electrode voltage, is applied across the unselected transistor strings. If the above method used for the NAND flash memory is employed in the write method according to the second embodiment, a voltage same as the well electrode voltage may be applied across the selected transistor string, and a write inhibit voltage may be applied across the unselected transistor strings. In this case, however, the write inhibit voltage is higher than the well electrode voltage. As a result, the write inhibit voltage may be conveyed to the substrate from the source or drain of a transistor of the unselected transistor strings, and may not be correctly conveyed. Accordingly, it may be possible that data may be written to a transistor of an unselected transistor string in the same column as the selected transistor. In the second embodiment, however, since the second write voltage applied across the selected transistor string is lower than the well electrode voltage, the write inhibit voltage to be applied across the unselected transistor strings can be set at the same value as the well electrode voltage. This means that no voltage that is higher than the well electrode voltage is applied across the unselected transistor strings. Writing data to transistors of unselected transistor strings in the same column as the selected transistor can be prevented in this manner.

The transistor to which data is written by the aforementioned write method does not return to the high-resistance state. Thus, the transistor becomes one-time programmable memory device.

Figure 16:
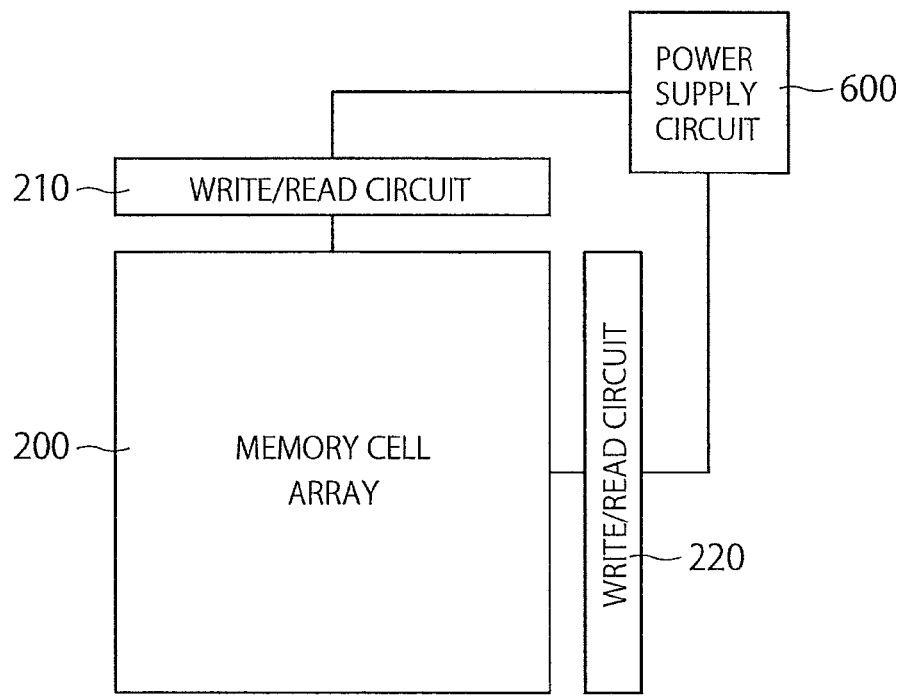
FIG. 16 is a block diagram showing a write/read unit used in the second, the fourth, and the sixth embodiments.

Such a write operation can be performed by, for example, a write/read unit shown in FIG. 16. The write/read unit includes a first write/read circuit 210 and a second write/read circuit 220. In a write operation, the first write/read circuit 210 applies a voltage to the wiring lines in the column direction of the memory cell array 200, i.e., the word lines $WL2_1$-$WL2_n$, using the voltage supplied from a power supply circuit 600. The second write/read circuit 220 applies a voltage to two terminals of each of the wiring lines in the row direction of the memory cell array 200, i.e., the transistor strings $201_1$-$201_m$ using the voltage supplied from the power supply circuit 600 in a write operation. A voltage from the power supply circuit 600 may be applied to the well electrode SUB2 by a third write circuit, or the well electrode SUB2 may be directly connected to a terminal for supplying a voltage from the power supply circuit 600 or voltage application terminal provided near a chip side, although such features are not shown in FIG. 16. The power supply circuit 600 includes a plurality of power supplies to supply voltages of different levels.

(Read Method)

If data is read from a specific transistor of the memory cell array 200 of the semiconductor nonvolatile memory device according to the second embodiment shown in FIG. 3, a first read voltage (for example 5 V) is applied to the word line to which the gate of the specific transistor is connected, a pass voltage (for example 0 V) is applied to the other word lines, a first voltage (for example 5 V) is applied to the source (or drain) of one of the transistors at the ends of the transistor string including the specific transistor, and, and a second read voltage (for example 4 V) is applied to the drain (or source) of the other. Whether data is written to the selected transistor is determined depending on the magnitude of the current flowing through the source (or drain) of each of the transistors at the ends of the transistor strings. For example, in order to determine whether data is written to the transistor $M2_{12}$, the first read voltage (for example 5 V) is applied to the word line $WL2_2$, a pass voltage (for example 0 V) is applied to the word lines $WL2_1$, $WL2_3$, . . . , $WL2_n$, the first voltage (for example 5 V) is applied to the source of the transistor $M2_{11}$, and the second read voltage (for example 4 V) is applied to the drain of the transistor $M2_{1n}$.

Such a read operation can be performed by, for example, the write/read unit shown in FIG. 16. In a read operation, the first write/read circuit 210 applies a voltage to the wiring lines in the column direction of the memory cell array 200, i.e., the word lines $WL2_1$-$WL2_n$, using the voltage supplied from the power supply circuit 600. The second write/read circuit 220 applies a voltage to two terminals of each of the wiring lines in the row direction of the memory cell array 200, i.e., the transistor strings $201_1$-$201_m$, using the voltage supplied from the power supply circuit 600 in a read operation.

Each memory cell of the second embodiment, like that of the first embodiment, includes a single transistor, and no selector is needed. Accordingly, if the capacity increases, the increase in chip area can be suppressed.

Third Embodiment

Figure 5:
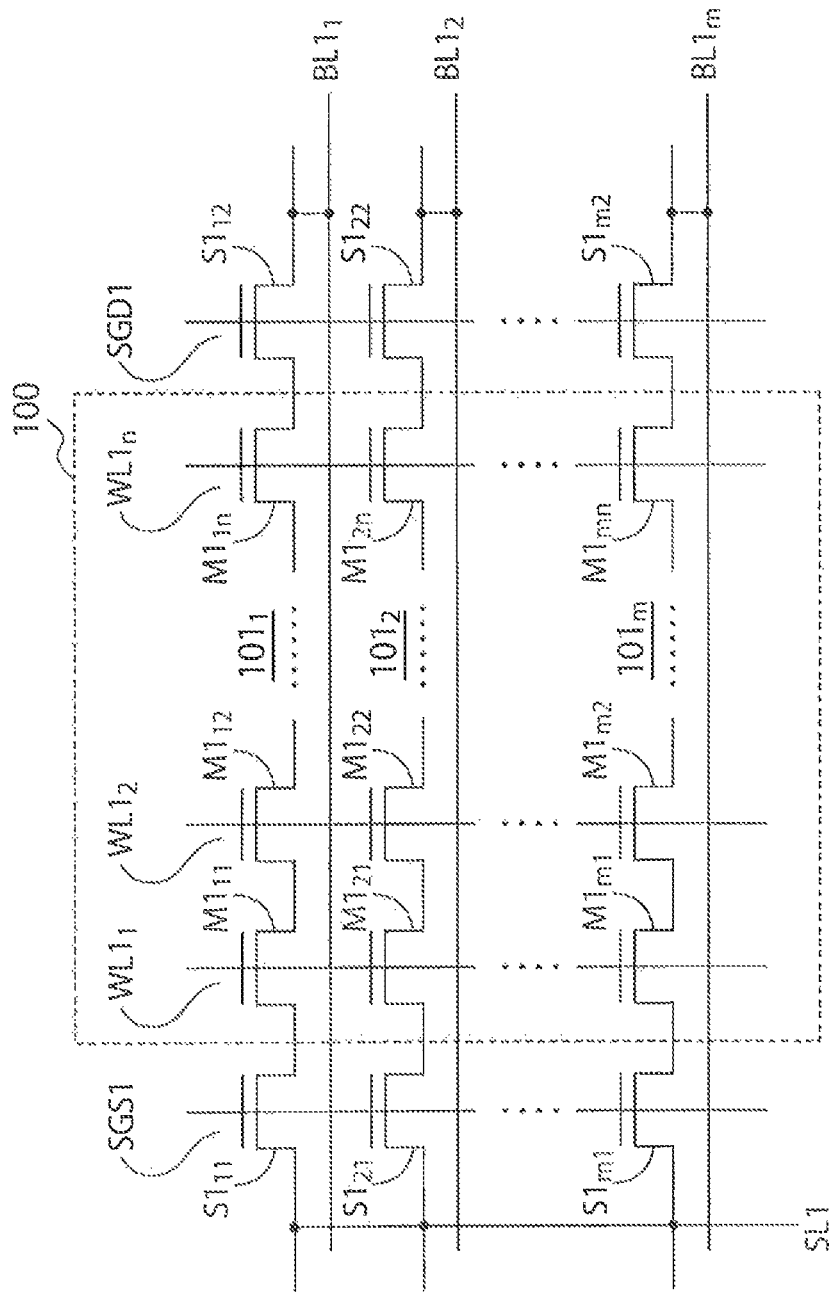
FIG. 5 is a diagram showing a semiconductor nonvolatile memory device according to a third embodiment.

FIG. 5 shows a semiconductor nonvolatile memory device according to a third embodiment. The semiconductor nonvolatile memory device according to the third embodiment is capable of writing data efficiently using the memory cell array 100 according to the first embodiment shown in FIG. 1.

In addition to the memory cell array 100 according to the first embodiment, the semiconductor nonvolatile memory device according to the third embodiment includes select transistors $S1_{11}$, . . . , $S1_{m1}$ and select transistors $S1_{12}$, . . . , $S1_{m2}$. The source of the transistor $M1_{i1}$ (i=1, . . . , m) located at one end of the transistor string $101_i$ (i=1, . . . , m) is connected to the drain of the select transistor $S1_{i1}$. The drain of the transistor $M1_{in}$ (i=1, . . . , m) located at the other end of the transistor string $101_i$ (i=1, . . . , m) is connected to the source of the select transistor $S1_{i2}$. The sources of the select transistors $S1_{11}$, . . . , $S1_{m1}$ are connected to a common wiring line (source line) SL1, and the drain of the select transistor $S1_{i2}$ (i=1, . . . , m) is connected to a wiring line (bit line) $BL1_i$ (i=1, . . . , m). The gate of the select transistor $S1_{11}$, . . . , $S1_{m1}$ is connected to a common wiring line SGS1, and the gate of the select transistor $S1_{12}$, . . . , $S1_{m2}$ is connected to a common wiring line SGD1. The wells on which the transistors $M1_{11}$, . . . , $M1_{mn}$ and the select transistors $S1_{11}$, . . . , $S1_{m1}$, $S1_{12}$, . . . , $S1_{m2}$ are formed are connected to a common well electrode SUB1, although this is not shown in FIG. 5. Here, the transistors $M1_{11}$, . . . , $M1_{mn}$ and the select transistors $S1_{11}$, . . . , $S1_{m1}$, $S1_{12}$, . . . , $S1_{m2}$ are n-channel transistors.

(Write Method)

Figure 6:
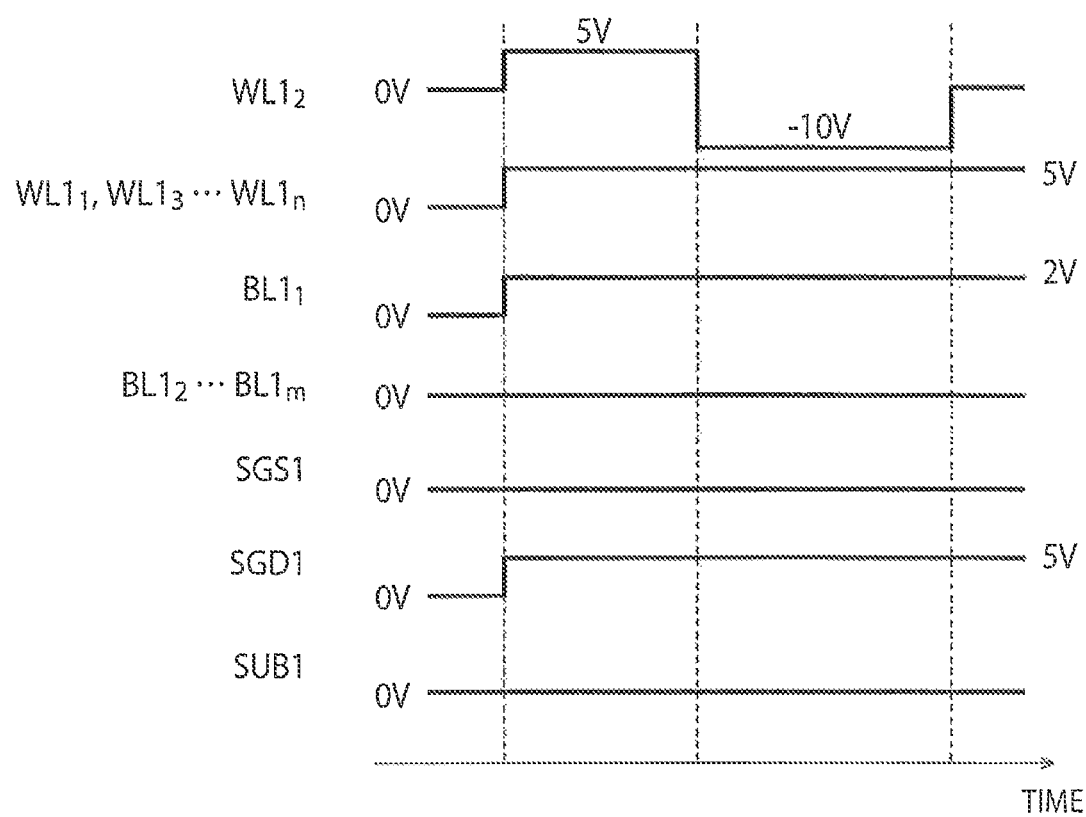
FIG. 6 is a waveform diagram for explaining a writing method of the semiconductor nonvolatile memory device according to the third embodiment.

A method of writing data to a specific transistor in the third embodiment will be described with reference to FIG. 6, which is a timing chart of the voltages to be applied to the respective wiring lines when data is written to the transistor $M1_{12}$.

The well electrode SUB1 is set at a ground voltage, and a pass voltage (for example 5 V) is applied to all the word lines $WL1_1$, . . . , $WL1_n$, a second write voltage (for example 2 V) is applied to the bit line $BL1_1$, the ground voltage is applied to the other bit lines $BL1_2$, . . . , $BL1_m$, the ground voltage is applied to the wiring line SGS1, and the pass voltage (for example 5 V) is applied to the wiring line SGD1. As a result, the transistors $M1_{11}$, . . . , $M1_{mn}$ and the select transistors $S1_{12}$, . . . , $S1_{m2}$ are turned ON, and the select transistors $S1_{11}$, . . . , $S1_{m1}$ are turned OFF. Accordingly, the voltages at the sources and the drains of the transistors $M1_{11}$, . . . , $M1_{1n}$ are boosted to the second write voltage. The voltages at the sources and the drains of the transistors $M1_{21}$, . . . , $M1_{mn}$ are kept at the ground voltage.

Then, the voltage applied to the word line $WL1_2$ is changed to a first write voltage (for example, −10 V). As a result, the potential difference between the gate and the source, or the gate and the drain of the transistor $M1_{12}$ becomes large enough to cause data to be written to this transistor. In FIG. 6, the pass voltage is kept being applied to the wiring line SGD1 and the second write voltage is kept being applied to the bit line $BL1_1$ after the voltage applied to the word line $WL1_2$ is changed from the pass voltage to the first write voltage. However, the voltage applied to the wiring line SGD1 can be the ground voltage if the voltages of the sources and the drains of the transistors $M1_{11}, \ldots, M1_{1n}$ are boosted to the second write voltage by applying the pass voltage to the word lines $WL1_1, \ldots, WL1_n$ and the wiring line SGD1 and applying the second write voltage to the bit line $BL1_1$. Specifically, after the voltages of all the word lines $WL1_1, \ldots, WL1_n$ and the wiring line SGD1 are changed to the pass voltage, and the voltage of the bit line $BL1_1$ is changed to the second write voltage, the voltage of the wiring line SGD1 may be changed to the ground voltage, and then the voltage applied to the word line $WL1_2$ may be changed to the first write voltage. The voltage applied to the bit line $BL1_1$ after the voltage applied to the wiring line SGD1 is changed to the ground voltage can be arbitrarily determined, but is preferably the ground voltage.

The case where data is written to the transistor $M1_{12}$ has been described. The method is the same if data is written to other transistors; a pass voltage is applied to all the word lines, a ground voltage is applied to the wiring SGS1, the pass voltage is applied to the wiring line SGD1, a second write voltage is applied to a bit line corresponding to the transistor string including the selected transistor, and the ground voltage is applied to the other bit lines, and thereafter, the voltage applied to the word line to which the gate of the selected transistor is connected is changed to the first write voltage. Data can be efficiently written to the selected transistor by the aforementioned operation.

In the third embodiment, the following relationship is met:
first write voltage<well electrode voltage<second write voltage<pass voltage.

In a known NAND flash memory, a voltage same as the well electrode voltage is applied to the bit line corresponding to the transistor string including the selected transistor, and a voltage (write inhibit voltage), which is higher than the well electrode voltage, is applied to the other bit lines. If the above method used for the NAND flash memory is employed in the write method according to the third embodiment, a voltage same as the well electrode voltage is applied to the bit line corresponding to the transistor string including the selected transistor, and the write inhibit voltage is applied to the other bit lines. In this case, however, the write inhibit voltage is lower than the well electrode voltage. As a result, the write inhibit voltage may be conveyed to the substrate from the source or drain of a transistor of an unselected transistor string, and may not be correctly conveyed. This may lead to writing of data to a transistor included in an unselected transistor string in the same column as the selected transistor. However, in the third embodiment, since the second write voltage applied to the bit line corresponding to the transistor string including the selected transistor is higher than the well electrode voltage, the write inhibit voltage to be applied to the other bit lines can be set at the same value as the well electrode voltage. This means that no voltage that is lower than the well electrode voltage is applied to the unselected bit lines. Writing data to transistors of unselected transistor strings in the same column as the selected transistor can be prevented in this manner.

Like the first embodiment, the write operation can be performed by, for example, the write/read unit shown in FIG. 15. The write/read unit includes the first write/read circuit 110 and the second write/read circuit 120. In a write operation, the first write/read circuit 110 applies a voltage supplied from a power supply circuit 500 to the wiring lines in the column direction of the memory cell array 100, i.e., the word lines $WL1_1$-$WL1_n$, the wiring line SGS1, and the wiring line SGD1. The second write/read circuit 120 applies a voltage to the wiring lines in the row direction of the memory cell array 100, i.e., the bit lines $BL1_1$-$BL1_m$, using the voltage supplied from the power supply circuit 500 in a write operation. A voltage from the power supply circuit 500 may be applied to the source line SL1 and the well electrode SUB1 by a third write circuit, or the source line SL1 and the well electrode SUB1 may be directly connected to a terminal for supplying a voltage from the power supply circuit 500 or a voltage application terminal provided near a chip side, although such features are not shown in FIG. 15. The power supply circuit 500 includes a plurality of power supplies for supplying voltages of different levels.

(Read Method)

A method of reading data in the semiconductor nonvolatile memory device according to the third embodiment shown in FIG. 5 will be described below.

If data is read from a specific transistor, a first read voltage (for example 0 V) is applied to the word line to which the gate of the specific transistor is connected, a pass voltage (for example 5 V) is applied to the other word lines and the wiring lines SGS1, SGD1, a second read voltage (for example 1 V) is applied to the bit line corresponding to the transistor string including the specific transistor, and a ground voltage is applied to the source line. Whether data is written to the specific transistor is determined depending on the magnitude of the current flowing through the bit line or the source line. For example, in order to determine whether data is written to the transistor $M1_{12}$, a first read voltage is applied to the word line $WL1_2$, a pass voltage is applied to the other word lines $WL1_1, WL1_3, \ldots, WL1_n$ and the wiring lines SGS1, SGD1, a second read voltage is applied to the bit line $BL1_1$, and a ground voltage is applied to the source line SL1.

Such a read operation can be performed by the write/read unit shown in FIG. 15, as in the case of the first embodiment. In a read operation, the first write/read circuit 110 applies a voltage to the wiring lines in the column direction of the memory cell array 100, i.e., the word lines $WL1_1$-$WL1_n$, the wiring line SGS1, and the wiring line SGD1, using the voltage supplied from the power supply circuit 500. The second write/read circuit 120 applies a voltage to the wiring lines in the row direction of the memory cell array 100, i.e., the bit lines $BL1_1$-$BL1_m$, using the voltage supplied from the power supply circuit 500.

As in the case of the first embodiment, if the capacity of the third embodiment increases, the increase in chip area can be suppressed.

Fourth Embodiment

Figure 7:
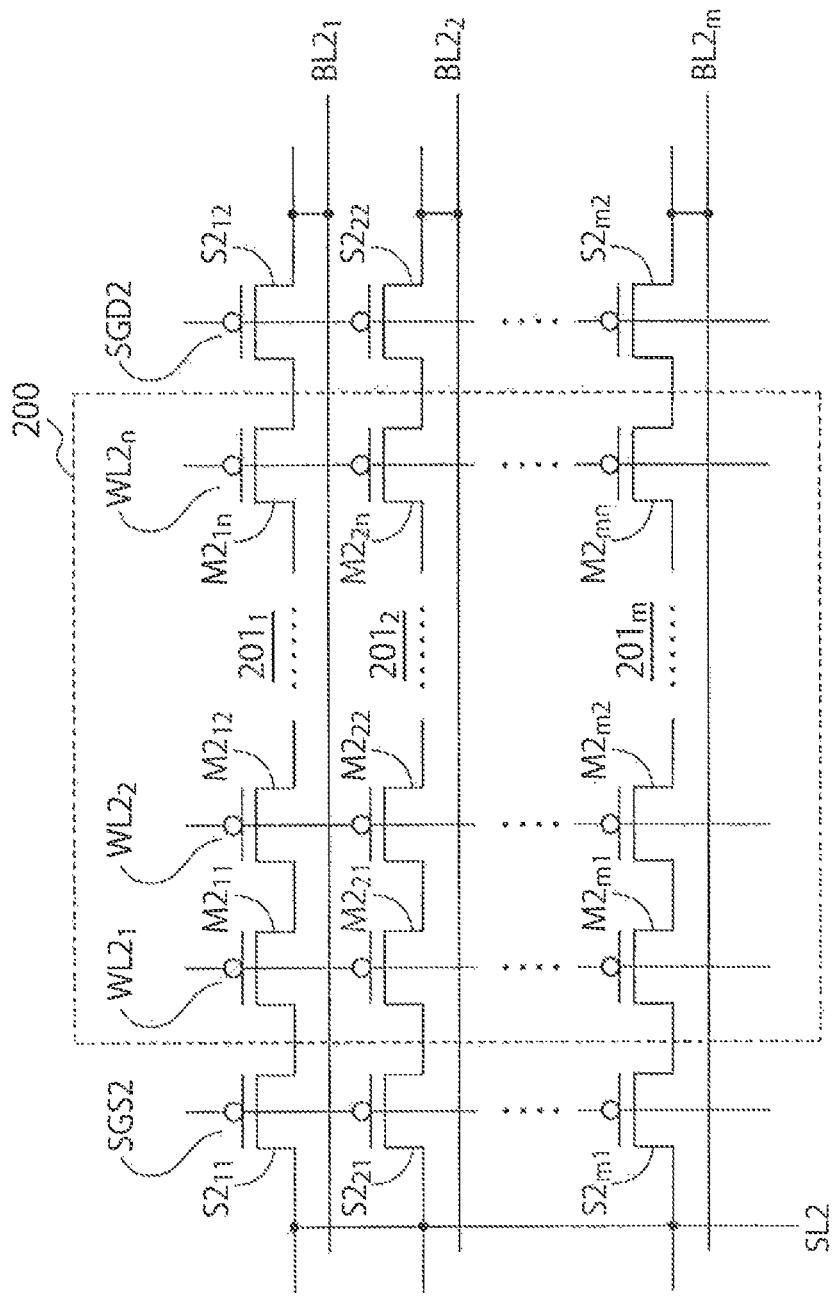
FIG. 7 is a diagram showing a semiconductor nonvolatile memory device according to a fourth embodiment.

FIG. 7 shows a semiconductor nonvolatile memory device according to a fourth embodiment. The semiconductor nonvolatile memory device according to the fourth embodiment includes the memory cell array 200 according to the second embodiment shown in FIG. 3 to write data efficiently.

In addition to the memory cell array 200 according to the second embodiment, the semiconductor nonvolatile memory device according to the fourth embodiment includes select transistors $S2_{11}, \ldots, S2_{m1}$ and select transistors $S2_{12}, S2_{m2}$. The source of a transistor $M2_{i1}$ (i=1, \ldots, m) at one end of a transistor string $201_i$ (i=1, \ldots, m) is connected to the drain of a select transistor $S2_{i1}$. The drain of a transistor $M2_{in}$ (i=1, \ldots, m) at the other end of the transistor string $201_i$ (i=1, \ldots, m) is connected to the source of a select transistor $S2_{i2}$. The sources of the select transistors $S2_{11}, \ldots, S2_{m1}$ are connected to a common wiring line (source line) SL2, and the drain of the select transistors $S2_{12}, \ldots, S2_{m2}$ are connected to wiring lines (bit lines) $BL2_1, \ldots, BL2_m$, respectively. The gates of the select transistors $S2_{11}, \ldots, S2_{m1}$ are connected to a common wiring line SGS2, and the gates of the select transistors $S2_{12}, \ldots, S2_{m2}$ are connected to a common wiring line SGD2, The wells of the transistors $M2_{11}, \ldots, M2_{mn}$ and the select transistors $S2_{11}, \ldots, S2_{m1}, S2_{12}, \ldots, S2_{m2}$ are connected to a common well electrode SUB2, although such a feature is not shown in FIG. 6. The transistors $M2_{11}, \ldots, M2_{mn}$ and the select transistors $S2_{11}, \ldots, S2_{m1}, S2_{12}, \ldots, S2_{m2}$ are p-channel transistors.

(Write Method)

Figure 8:
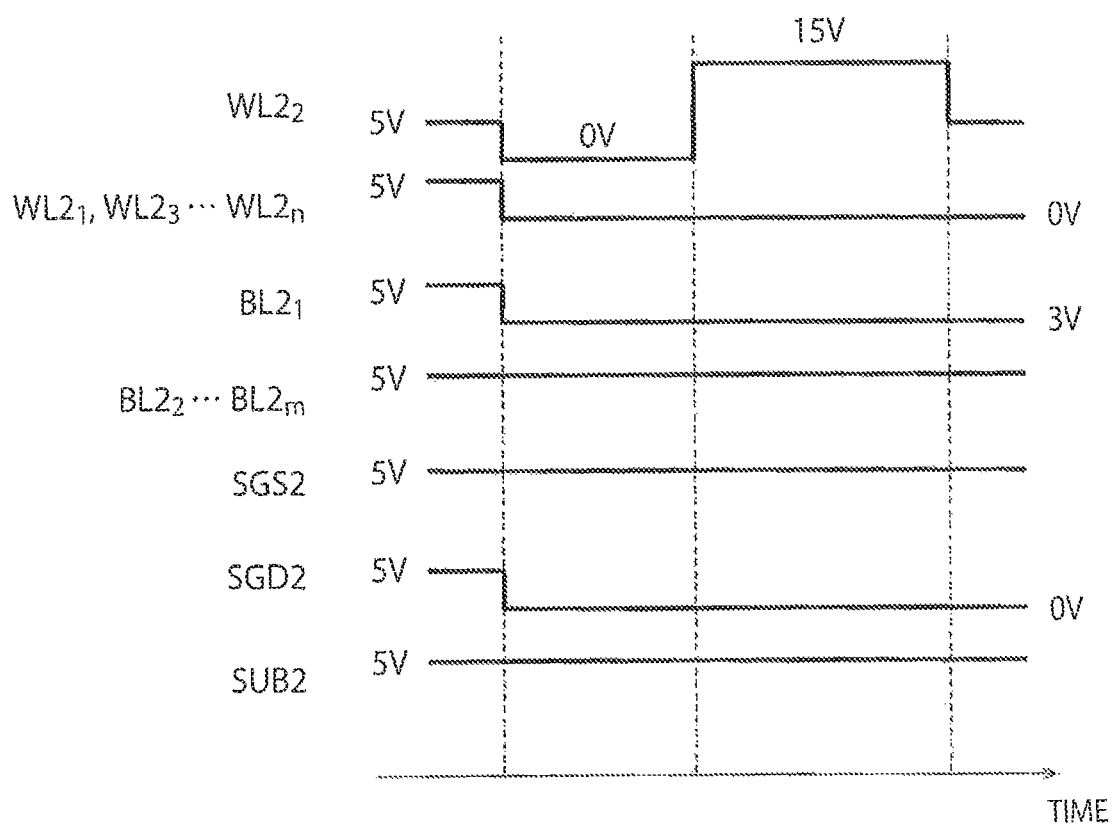
FIG. 8 is a waveform diagram for explaining the writing method of the semiconductor nonvolatile memory device according to the fourth embodiment.

A method of writing data to a specific transistor according to the fourth embodiment will be described with reference to FIG. 8. FIG. 8 is a timing chart of voltages to be applied to the respective wiring lines when data is written to the transistor $M2_{12}$.

A first voltage (for example 5 V) is applied to the well electrode SUB2, and a pass voltage (for example 0 V) is applied to all the word lines $WL2_1, \ldots, WL2_n$, a second write voltage (for example 3 V) is applied to the bit line $BL2_1$, the first voltage is applied to the other bit lines $BL2_2, \ldots, BL2_m$, the first voltage is applied to the wiring line SGS2, and the pass voltage (for example 0 V) is applied to the wiring line SGD2. As a result, the transistors $M2_{11}, \ldots, M2_{mn}$ and the select transistors $S2_{12}, \ldots, S2_{m2}$ are in the ON state, and the select transistors $S2_{11}, \ldots, S2_{m1}$ are in the OFF state. The voltage of the sources and the drains of the transistors $M2_{11}, \ldots, M2_{1n}$ is boosted to the second write voltage. The source voltage and the drain voltage of the respective transistors $M2_{21}, \ldots, M2_{mn}$ are kept at the first voltage.

Then, the voltage applied to the word line $WL2_2$ is changed to a first write voltage (for example 15 V). This causes the potential difference between the gate and the source, or the gate and the drain of the transistor $M2_{12}$ to be substantially large to write data. In FIG. 8, the voltage applied to the wiring line SGD2 is kept being the pass voltage, and the voltage applied to the bit line $BL2_1$ is kept being the second write voltage after the voltage applied to the word line $WL2_2$ is changed from the pass voltage to the first write voltage. However, the voltage applied to the wiring line SGD2 can be the first voltage if the voltages of the sources and the drains of the transistors $M2_{11}, \ldots, M2_{1n}$ are boosted to the second write voltage by applying the pass voltage to the word lines $WL2_1, \ldots, WL2_n$ and the wiring line SGD2 and applying the second write voltage to the bit line $BL2_1$. Specifically, after the voltages of all the word lines $WL2_1, \ldots, WL2_n$ and the wiring line SGD2 are changed to the pass voltage, and the voltage of the bit line $BL2_1$ is changed to the second write voltage, the voltage of the wiring line SGD2 may be changed to the first voltage, and then the voltage applied to the word line $WL2_2$ may be changed to the first write voltage. The voltage applied to the bit line $BL2_1$ after the voltage applied to the wiring line SGD2 is changed to the first voltage can be arbitrarily determined, but preferably the first voltage.

The case where data is written to the transistor $M2_{12}$ has been described. The method is the same if data is written to the other transistors; a pass voltage is applied to all the word lines, and a first voltage is applied to the wiring line SGS2, the pass voltage is applied to the wiring line SGD2, a second write voltage is applied to the bit line corresponding to the transistor string including the selected transistor, and the first voltage is applied to the other bit lines. Then, the voltage of the word line to which the gate of the selected transistor is connected is changed to the first write voltage promptly. Data can be efficiently written to the selected transistor in this manner.

In the fourth embodiment, the following relationship is met:

first write voltage>well electrode voltage>second write voltage>pass voltage.

In a known NAND flash memory, a voltage same as the well electrode voltage is applied to the bit line corresponding to the transistor string including the selected transistor, and a voltage (write inhibit voltage), which is lower than the well electrode voltage, is applied to the other bit lines. If the above method used for the NAND flash memory is employed in the write method according to the fourth embodiment, a voltage same as the well electrode voltage may be applied to the bit line corresponding to the transistor string including the selected transistor, and the write inhibit voltage may be applied to the other bit line. In this case, however, the write inhibit voltage is higher than the well electrode voltage. As a result, the write inhibit voltage may be conveyed to the substrate from the source or the drain of a transistor of the unselected transistor strings, and may not be correctly conveyed. This may cause data to be written to a transistor of an unselected transistor string in the same column as the selected transistor. In the fourth embodiment, however, since the second write voltage applied to the bit line corresponding to the transistor string including the selected transistor is lower than the well electrode voltage, the write inhibit voltage applied to the other bit lines can be set at a voltage same as the well electrode voltage. This means that no voltage that is higher than the well electrode voltage is applied to the bit lines corresponding to the unselected transistor strings. Writing data to a transistor of an unselected transistor string in the same column as the selected transistor can be prevented in this manner.

As in the case of the second embodiment, such a write operation can be performed by the write/read unit shown in FIG. 16. The write/read unit includes the first write/read circuit 210 and the second write/read circuit 220. In a write operation, the first write/read circuit 210 applies a voltage to the wiring lines in the column direction of the memory cell array 200, i.e., the word lined $WL2_1$-$WL2_n$, the wiring line SGS2, and the wiring line SGD2 using the voltage supplied from the power supply circuit 600. The second write/read circuit 220 applies a voltage to the wiring lines in the row direction of the memory cell array 200, i.e., the bit lines $BL2_1$-$BL2_m$, using the voltage supplied from the power supply circuit 600 in a write operation. The voltage from the power supply circuit 600 may be applied to the source line SL2 and the well electrode SUB2 by means of a third write circuit, or the source line SL2 and the well electrode SUB2 may be directly connected to a terminal for supplying the voltage from the power supply circuit 600 or voltage application terminal provided near a chip side, although such features are not shown in FIG. 16. The power supply circuit 600 includes a plurality of power supplies to supply voltages of different levels.

(Read Method)

A method of reading data in the semiconductor nonvolatile memory device according to the fourth embodiment shown in FIG. 7 will be described below.

If data is read from a specific transistor, a first read voltage (for example 5 V) is applied to the word line to which the gate of the specific transistor is connected, a pass voltage (for example 0 V) is applied to the other word lines and the wiring lines SGS2, SGD2, a second read voltage (for example 4 V) is applied to the bit line corresponding to the transistor string including specific transistor, and a first voltage (for example 5 V) is applied to the source line. Whether data is written to the specific transistor is determined depending on the magnitude of the current flowing through the bit line or the source line. For example, in order to determine whether data is written to the transistor $M2_{12}$, the first read voltage is applied to the word line $WL2_2$, the pass voltage is applied to the other word lines $WL2_1, WL2_3, \ldots, WL2_n$ and the wiring lines SGS2, SGD2, the second read voltage is applied to the bit line $BL2_1$, and the first voltage is applied to the source line SL2.

Such a read operation can be performed by, for example, the write/read unit shown in FIG. 16, as in the case of the second embodiment. In a read operation, the first write/read circuit 210 applies a voltage to the wiring lines in the column direction of the memory cell array 200, i.e., the word lines $WL2_1$-$WL2_n$, the wiring line SGS2, and the wiring line SGD2, using the voltage supplied from the power supply circuit 600. The second write/read circuit 220 applies a voltage to the wiring lines in the row direction in the memory cell array 200, i.e., the bit lines $BL2_1$-$BL2_m$, using the voltage supplied from the power supply circuit 600 in a read operation.

As in the case of the second embodiment, the capacity of the fourth embodiment increases, the increase in chip area can be suppressed.

Fifth Embodiment

Figure 9:
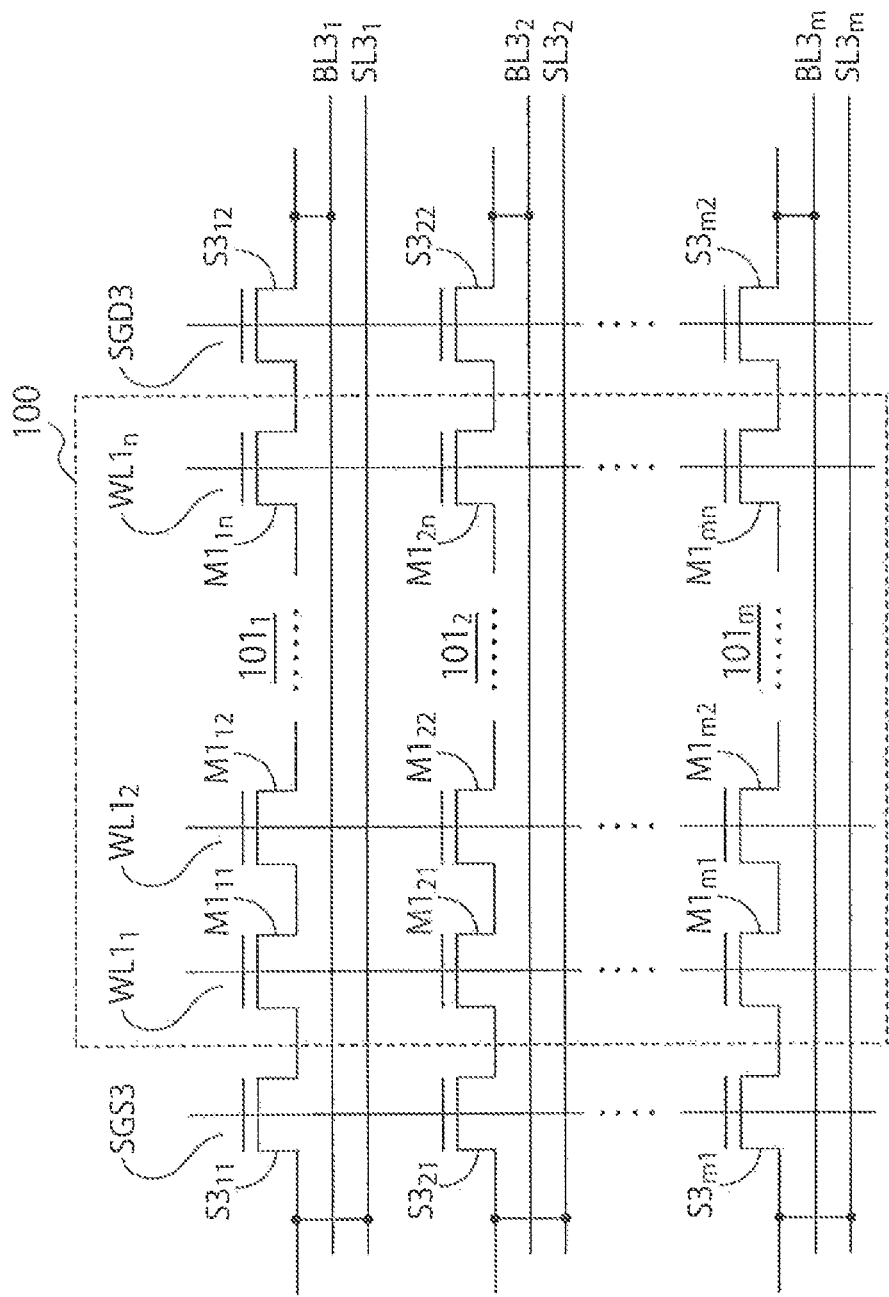
FIG. 9 is a diagram showing a semiconductor nonvolatile memory device according to a fifth embodiment.

FIG. 9 shows a semiconductor nonvolatile memory device according to a fifth embodiment. The semiconductor nonvolatile memory device according to the fifth embodiment includes the memory cell array 100 according to the first embodiment shown in FIG. 1 to write data efficiently.

In addition to the memory cell array 100 according to the first embodiment, the semiconductor nonvolatile memory device according to the fifth embodiment includes select transistors $S3_{11}, \ldots, S3_{m1}$ and select transistors $S3_{12}, \ldots, S3_{m2}$. The source of a transistor $M1_{i1}$ at one end of a transistor string $101_i$ (i=1, . . . , m) is connected to the drain of a select transistor $S3_{i1}$. The drain of a transistor $M1_{in}$ (i=1, . . . , m) at the other end of the transistor string $101_i$ (i=1, . . . , m) is connected to the source of a select transistor $S3_{i2}$. The sources of the select transistors $S3_{11}, \ldots, S3_{m1}$ are connected to the wiring lines (source lines) $SL3_1, \ldots, SL3_m$, respectively, and the drains of the select transistors $S3_{12}, \ldots, S3_{m2}$ are connected to the wiring lines (bit lines) $BL3_1 \ldots, BL3_m$, respectively. The gates of the select transistors $S3_{11}, \ldots, S3_{m1}$ are connected to a common wiring line SGS3, and the gates of the select transistors $S3_{12}, \ldots, S3_{m2}$ are connected to a common wiring line SGD3. The wells of the transistors $M1_{11}, \ldots, M1_{mn}$ and the select transistor $S3_{11}, \ldots, S3_{m1}, S3_{12}, \ldots, S3_{m2}$ are connected to a common well electrode SUB1, although this feature is not shown in FIG. 9. The transistors $M1_{11}, \ldots, M1_{mn}$ and the select transistors $S3_{11}, \ldots, S3_{m1}, S3_{12}, \ldots, S3_{m2}$ are n-channel transistors.

(Write Method)

Figure 10:
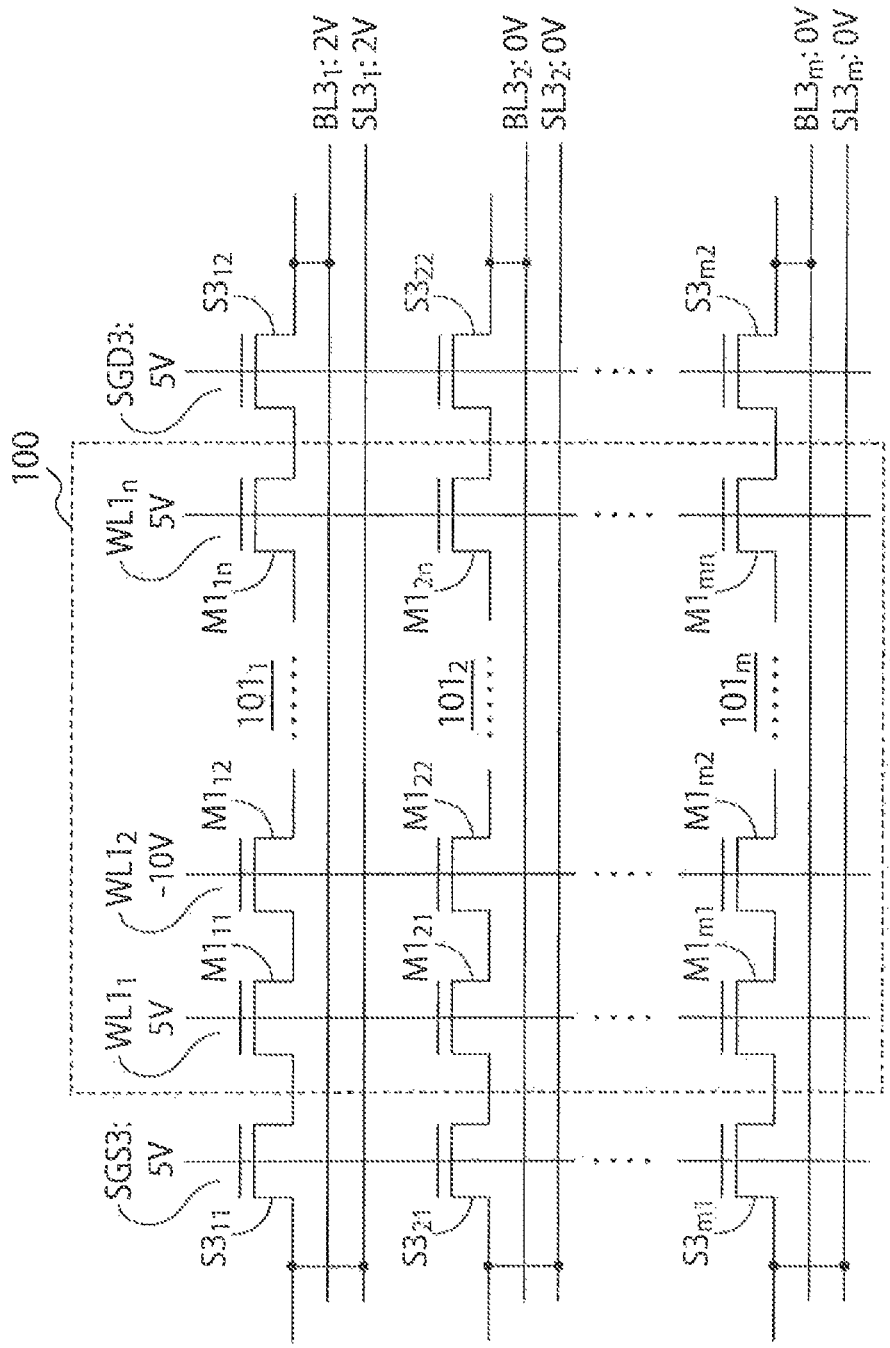
FIG. 10 is an explanatory diagram illustrating a writing method of the semiconductor nonvolatile memory device according to the fifth embodiment.

A method of writing data to a specific transistor according to the fifth embodiment will be described with reference to FIG. 10. FIG. 10 shows voltages to be applied to the respective wiring lines when data is written to the transistor $M1_{12}$. A ground voltage is applied to the well electrode SUB1, and a first write voltage (for example, −10 V) is applied to the word line $WL1_2$, a pass voltage (for example 5 V) is applied to the other word lines $WL1_1, WL1_3, \ldots, WL1_n$, a second write voltage (for example 2 V) is applied to the bit line $BL3_1$, the ground voltage is applied to the other bit lines $BL3_2, \ldots, BL3_m$, a second write voltage (for example 2 V) is applied to the source line $SL3_1$, the ground voltage is applied to the other source lines $SL3_2, \ldots, SL3_m$, and the pass voltage (for example 5 V) is applied to the wiring lines SGS3 and SGD3.

This makes the potential difference between the gate and the source, or between the gate and the drain of the transistor $M1_{12}$ sufficiently large to write data.

In the fifth embodiment, the following relationship is met:
first write voltage<well electrode voltage second write voltage<pass voltage.

In a known NAND flash memory, a voltage same as the well electrode voltage is applied to the bit line corresponding to the transistor string including the selected transistor, a voltage (write inhibit voltage) higher than the well electrode voltage is applied to the other bit lines, the voltage same as the well electrode voltage is applied to the source line corresponding to the transistor string including the selected transistor, and a voltage (write inhibit voltage) higher than the well electrode voltage is applied to the other source lines. If the above method used for the NAND flash memory is employed in the write method according to the fifth embodiment, a voltage same as the well electrode voltage is applied to the bit line corresponding to the transistor string including the selected transistor, a write inhibit voltage is applied to the other bit lines, the voltage same as the well electrode voltage is applied to the source line corresponding to the transistor string including the selected transistor, and a write inhibit voltage is applied to the other source lines. In this case, however, the write inhibit voltage is lower than the well electrode voltage. As a result, the write inhibit voltage may be conveyed to the substrate from the source or the drain of a transistor of an unselected transistor string, and thus may not be correctly conveyed. This may cause data to be written to a transistor of an unselected transistor string in the same column as the selected transistor. In the fifth embodiment, however, since the second write voltage applied to the bit line and the source line corresponding to the transistor string including the selected transistor is higher than the well electrode voltage, the write inhibit voltage applied to the other bit lines and the source lines can be set at a value same as the well electrode voltage. This means that no voltage that is lower than the well electrode voltage is applied to the unselected bit lines or source lines. Writing data to a transistor of an unselected transistor string in the same column as the selected transistor can be prevented in this manner.

The case where data is written to the transistor $M1_{12}$ has been described. The method is the same if data is written to the other transistors; a first write voltage is applied to the word line to which the gate of the selected transistor is connected, a pass voltage is applied to the other word lines, a second write voltage is applied to the bit line corresponding to the transistor string including the selected transistor, a ground voltage is applied to the other bit lines, the second write voltage is applied to the source line corresponding to the transistor string including the selected transistor, the ground voltage is applied to the other source lines, and the pass voltage is applied to the wiring lines SGS3 and SGD3. Data can be efficiently written to the selected transistor in this manner.

As in the case of the first embodiment, such a write operation can be performed by means of, for example, the write/read unit shown in FIG. 15. The write/read unit includes the first write/read circuit 110 and the second write/read circuit 120. In a write operation, the first write/read circuit 110 applies a voltage to the wiring lines in the column direction of the memory cell array 100, i.e., the word lines $WL1_1$-$WL1_n$, the wiring line SGS3, and the wiring line SGD3, using the voltage supplied from the power supply circuit 500. The second write/read circuit 120 applies a voltage to the wiring lines in the row direction of the memory cell array 100, i.e., the source lines $SL3_1$-$SL3_m$ and the bit lines $BL3_1$-$BL3_m$, using the voltage supplied from the power supply circuit 500 in a write operation. A voltage from the power supply circuit 500 may be applied to the well electrode SUB1 by means of a third write circuit, or the well electrode SUB1 may be directly connected to a terminal for supplying a voltage from the power supply circuit 500 or a voltage application terminal provided near a chip side, although such features are not shown in FIG. 15. The power supply circuit 500 includes a plurality of power supplies for supplying voltages of different levels.

(Read Method)

A method of reading data in the semiconductor nonvolatile memory device according to the fifth embodiment will be described below.

If a data is read from a specific transistor, a first read voltage (for example 0 V) is applied to the word line to which the gate of the specific transistor is connected, a pass voltage (for example 5 V) is applied to the other word lines and the wiring lines SGS3, SGD3, a second read voltage (for example 1 V) is applied to the bit line corresponding to the transistor string including the specific transistor, and a ground voltage is applied to the source line corresponding to the transistor string including the specific transistor. Whether data is written to the specific transistor is determined depending on the magnitude of the current flowing through the bit line or the source line. For example, in order to determine whether data is written to the transistor $M1_{12}$, a first read voltage is applied to the word line $WL1_2$, a pass voltage is applied to the other word lines $WL1_1$, $WL1_3$, ..., $WL1_n$ and the wiring lines SGS3, SGD3, a second read voltage is applied to the bit line $BL3_1$, and a ground voltage is applied to the source line $SL3_1$.

Such a read operation can be performed by the write/read unit shown in FIG. 15, as in the case of the first embodiment. In a read operation, the first write/read circuit 110 applies a voltage to the wiring lines in the column direction of the memory cell array 100, i.e., the word lines $WL1_1$-$WL1_n$, the wiring line SGS3, and the wiring line SGD3, using a voltage supplied from the power supply circuit 500. The second write/read circuit 120 applies a voltage to the wiring lines in the row direction of the memory cell array 100, i.e., the source lines $SL3_1$-$SL3_m$ and the bit lines $BL1_1$-$BL1_m$, using a voltage supplied from the power supply circuit 500 in a read operation.

As in the case of the first embodiment, if the capacity of the fifth embodiment increases, the increase in chip area can be suppressed.

Sixth Embodiment

Figure 11:
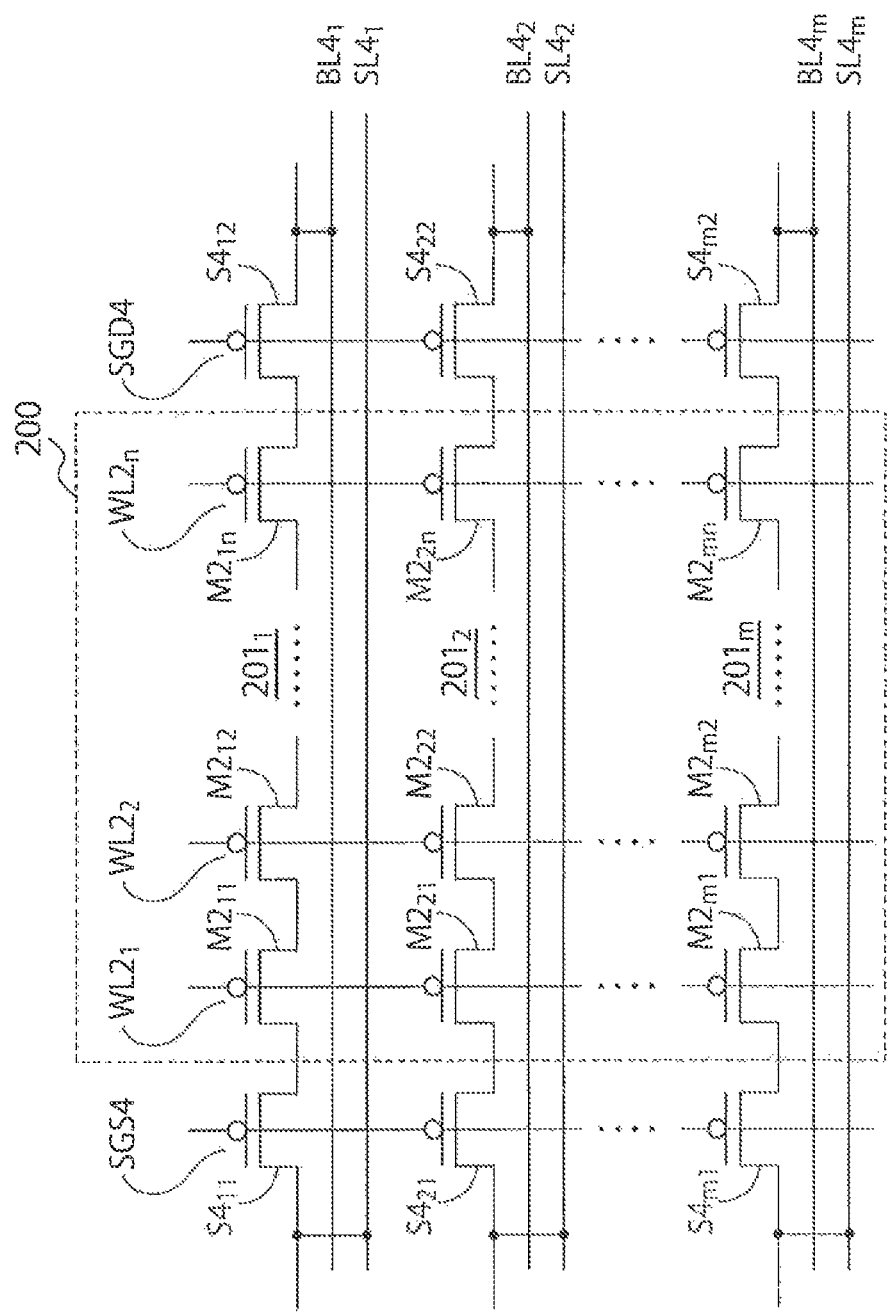
FIG. 11 is a diagram showing a semiconductor nonvolatile memory device according to a sixth embodiment.

FIG. 11 shows a semiconductor nonvolatile memory device according to a sixth embodiment. The semiconductor nonvolatile memory device according to the sixth embodiment includes the memory cell array 200 according to the second embodiment shown in FIG. 3 to write data efficiently.

In addition to the memory cell array 200 according to the second embodiment, the semiconductor nonvolatile memory device according to the sixth embodiment includes select transistors $S4_{11}$, ..., $S4_{m1}$ and select transistors $S4_{12}$, ..., $S4_{m2}$. The source of a transistor $M2_{i1}$ at one end of a transistor string $201_i$ (i=1, ..., m) is connected to the drain of a select transistor $S4_{i1}$. The drain of a transistor $M2_{in}$ at the other end of the transistor string $201_i$ (i=1, ..., m) is connected to the source of a select transistor $S4_{i2}$. The sources of the select transistors $S4_{11}$, ..., $S4_{m1}$ are connected to the respective wiring lines (source lines) $SL4_1$, ..., $SL4_m$, and the drains of the select transistors $S4_{12}$, ..., $S4_{m2}$ are connected to the respective wiring lines (bit lines) $BL4_1$, ..., $BL4_m$. The gates of the select transistors $S4_{11}$, ..., $S4_{m1}$ are connected to a common wiring line SGS4, and the gates of the select transistors $S4_{12}$, ..., $S4_{m2}$ are connected to a common wiring line SGD4. The wells of the transistors $M2_{11}$, ..., $M2_{mn}$ and the select transistors $S4_{11}$, ..., $S4_{m1}$, $S4_{12}$, ..., $S4_{m2}$ are connected to a common well electrode SUB2, although this feature is not shown in FIG. 11. The transistors $M2_{11}$, ..., $M2_{mn}$ and the select transistors $S4_{11}$, ..., $S4_{m1}$, $S4_{12}$, ..., $S4_{m2}$ are p-channel transistors.

(Write Method)

Figure 12:
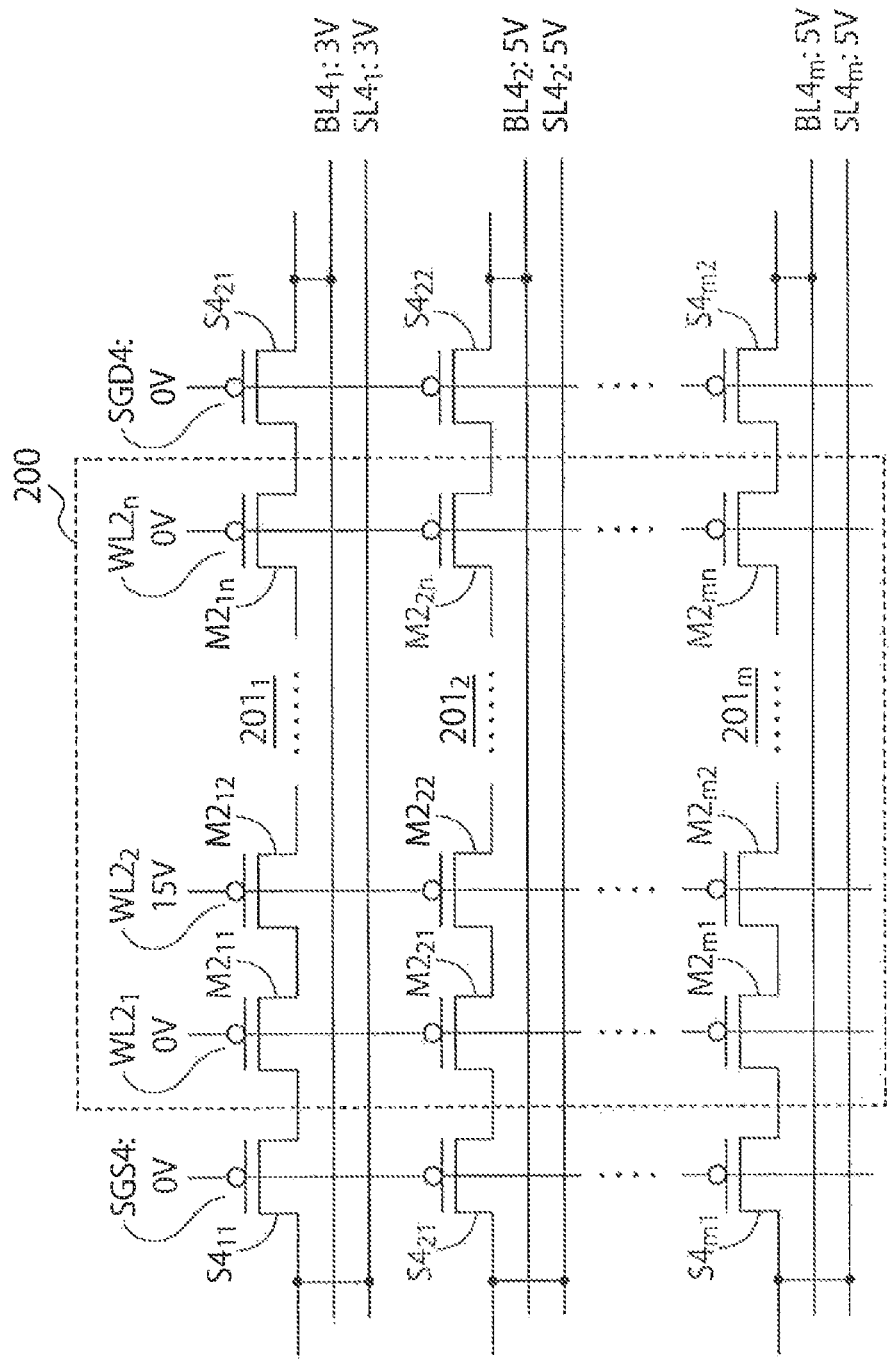
FIG. 12 is an explanatory diagram illustrating the semiconductor nonvolatile memory device according to the sixth embodiment.

A method of writing data to a specific transistor according to the sixth embodiment will be described with reference to FIG. 12. FIG. 12 shows voltages to be applied to the respective wiring lines when data is written to the transistor $M2_{12}$. A first voltage (for example 5 V) is applied to the well electrode SUB2, and a first write voltage (for example 15 V) is applied to the word line $WL2_2$, a pass voltage (for example 0 V) is applied to the other word lines $WL2_1$, $WL2_3$, ..., $WL2_n$, a second write voltage (for example 3 V) is applied to the bit line $BL4_1$, the first voltage is applied to the other bit lines $BL4_2$, ..., $BL4_m$, the second write voltage (for example 3 V) is applied to the source line $SL4_1$, the first voltage is applied to the other source lines $SL4_2$, ..., $SL4_m$, and the pass voltage (for example 0 V) is applied to the wiring lines SGS4 and SGD4. As a result, the potential difference between the gate and the source, or the gate and the drain of the transistor $M2_{12}$ becomes sufficiently large to write data.

In the sixth embodiment, the following relationship is met:
first write voltage>well electrode voltage>second write voltage>pass voltage.

In a known NAND flash memory, a voltage same as the well electrode voltage is applied to the bit line corresponding to the transistor string including the selected transistor, a voltage (write inhibit voltage) lower than the well electrode voltage is applied to the other bit lines, the voltage same as the well electrode voltage is applied to the source line corresponding to the transistor string including the selected transistor, and the voltage (write inhibit voltage) lower than the well electrode voltage is applied to the other source lines. If the above method for the NAND flash memory is employed in the write method according to the sixth embodiment, a voltage same as the well electrode voltage may be applied to the bit line corresponding to the transistor string including the selected transistor, a write inhibit voltage may be applied to the other bit lines, the voltage same as the well electrode voltage may be applied to the source line corresponding to the transistor string including the selected transistor, and the write inhibit voltage may be applied to the other source lines. In this case, however, the write inhibit voltage is higher than the well electrode voltage. As a result, the write inhibit voltage may be conveyed to the substrate from the source or the drain of a transistor of the unselected transistor strings, and thus may not be correctly conveyed. This may cause data to be written to a transistor of an unselected transistor string in the same column as the selected transistor. In the sixth embodiment, however, since the second write voltage applied to the bit line and the source line corresponding to the transistor string including the selected transistor is lower than the well electrode voltage, the write inhibit voltage applied to the other bit lines and source lines can be set to be same as the well electrode. This means that no voltage that is higher than the well electrode voltage is applied to the bit lines or the source lines corresponding to the unselected transistor strings. Writing data to a transistor of an unselected transistor string in the same column as the selected transistor can be prevented in this manner.

The case where data is written to the transistor $M2_{12}$ has been described. The method is the same if data is written to the other transistors; for example, a first write voltage is applied to the word line to which the gate of the selected transistor is connected, a pass voltage is applied to the other word lines, a second write voltage is applied to the bit line corresponding to the transistor string including the selected transistor, a first voltage is applied to the other bit lines, the second write voltage is applied to the source line corresponding to the transistor string including the selected transistor, the first voltage is applied to the other source lines, and the pass voltage is applied to the wiring lines SGS4 and SGD4. Data can be efficiently written to the selected transistor in this manner.

As in the case of the second embodiment, such a write operation can be performed by the write/read unit shown in FIG. 16. The write/read unit includes the first write/read circuit 210 and the second write/read circuit 220. In a write operation, the first write/read circuit 210 applies a voltage to the wiring lines in the column direction of the memory cell array 200, i.e., the word lines $WL2_1$-$WL2_n$, the wiring SGS4, and the wiring SGD4, using a voltage from the power supply circuit 600. The second write/read circuit 220 applies a voltage to the wiring lines in the row direction of the memory cell array 200, i.e., the source lines $SL4_1$-$SL4_m$ and the bit lines $BL4_1$-$BL4_m$, using a voltage supplied from the power supply circuit 600 in a write operation. The voltage supplied from the power supply circuit 600 may be applied to the well electrode SUB2 by means of a third write circuit, or the well electrode SUB2 may be directly connected to a terminal for supplying the voltage from the power supply circuit 600 or voltage application terminal provided near a chip side, although such features are not shown in FIG. 16. The power supply circuit 600 includes a plurality of power supplies to supply voltages of different levels.

(Read Method)

A method of reading data in the semiconductor nonvolatile memory device according to the sixth embodiment shown in FIG. 11 will be described below.

If data is read from a specific transistor, a first read voltage (for example 5 V) is applied to the word, line to which the gate of the specific transistor is connected, a pass voltage (for example 0 V) is applied to the other word lines and the wiring lines SGS4, SGD4, a second read voltage (for example 4 V) is applied to the bit line corresponding to the transistor string including the specific transistor, and a first voltage (for example 5 V) is applied to the source line corresponding to the transistor string including the specific transistor. Whether data is written to the specific transistor is determined depending on the magnitude of the current flowing through the bit line or the source line. For example, in order to determine whether data is written to the transistor $M2_{12}$, the first read voltage is applied to the word line $WL2_2$, the pass voltage is applied to the other word lines $WL2_1$, $WL2_3$, ..., $WL2_n$ and the wiring lines SGS4, SGD4, the second read voltage is applied to the bit line $BL4_1$, and the first voltage is applied to the source line $SL4_1$.

Such a read operation can be performed by, for example, the write/read unit shown in FIG. 16, as in the case of the second embodiment. In a read operation, the first write/read circuit 210 applies a voltage to the wiring lines in the column direction of the memory cell array 200, i.e., the word lines $WL2_1$-$WL2_n$, the wiring line SGS4, and the wiring line SGD4, using a voltage supplied from the power supply circuit 600. The second write/read circuit 220 applies a voltage to the wiring lines in the row direction in the memory cell array 200, i.e., the source lines $SL4_1$-$SL4_m$ and the bit lines $BL4_1$-$BL4_m$, using a voltage supplied from the power supply circuit 600 in a read operation.

As in the case of the second embodiment, if the capacity of the sixth embodiment increases, an increase in chip area can be suppressed.

Next, a preferable transistor structure to form any of the semiconductor nonvolatile memory devices according to the first to the sixth embodiments will be described below.

Figure 13:
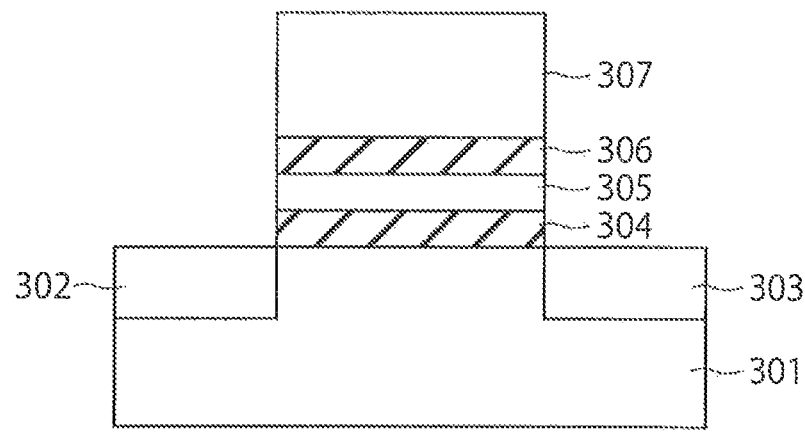
FIG. 13 is a cross-sectional view of a first specific example of a transistor used in each embodiment.

Each of the transistors ($M1_{11}$, ..., $M1_{mn}$ and $M2_{11}$, ..., $M2_{mn}$) used as one-time programmable memories in the respective embodiments may have a structure in which a charge storage film is disposed between a semiconductor region 301 and a gate electrode 307, as shown in FIG. 13. The transistor having the structure shown in FIG. 13 includes a source region 302 and a drain region 303 that are separated from each other in the semiconductor region 301, a first insulating film 304 disposed in a channel region between the source region 302 and the drain region 303 on the semiconductor region 301, a charge storage film 305 disposed on the first insulating film 304, a second insulating film 306 disposed on the charge storage film 305, and the gate electrode 307 disposed on the second insulating film 306. If the transistor is an n-channel transistor, the semiconductor region 301 is a p-type semiconductor region, and the source region 302 and the drain region 303 are n-type semiconductor regions.

If the transistor is a p-channel transistor, the semiconductor region 301 is an n-type semiconductor region, and the source region 302 and the drain region 303 are p-type semiconductor regions.

The charge storage film 305 may be a p-doped or n-doped polycrystalline silicon film, or an insulating silicon nitride film or silicon oxynitride film. Alternatively, an insulating silicon nitride film or silicon oxynitride film may be disposed on a p-doped or n-doped polycrystalline silicon film to form the charge storage film 305.

Each of the first insulating film 304, the second insulating film 306, and the gate electrode 307 may be a single material film, or a multilayer film including films of a plurality of materials.

The transistors with a charge storage film as described above are used as memory transistors of flash memories, in which data can be repeatedly written and erased. If the transistors with a charge storage film are used as memory transistors of any of the first to the sixth embodiments, data of a specific memory transistor may be permanently erased. Here, a write state means that the threshold voltage of an n-channel memory transistor is relatively high (in the case of a p-channel memory transistor, it is relatively low), and an erase state means that the threshold voltage of an n-channel memory transistor is relatively low (in the case of a p-channel memory transistor, it is relatively high). Although the data storing time is finite in a conventional flash memory, if the first to the sixth embodiments are applied to flash memories, the erase state can be permanently kept. As a result, the reliability of data can be improved.

Figure 14:
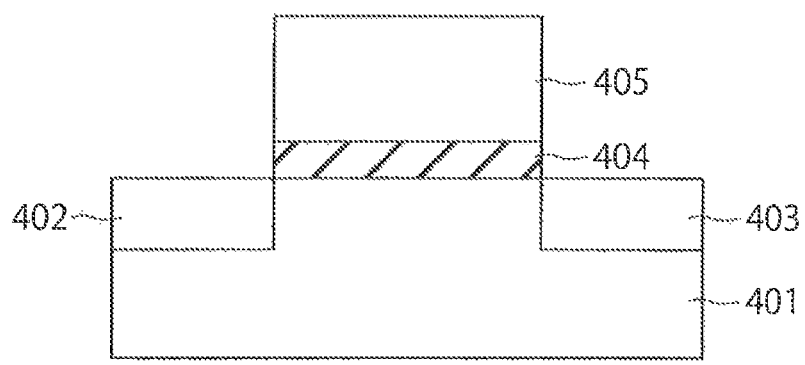
FIG. 14 is a cross-sectional view of a second specific example of a transistor used in each embodiment.

FIG. 14 shows another transistor structure. The transistors $M1_{11}$, ..., $M1_{mn}$ or $M2_{11}$, ..., $M2_{mn}$) used as one-time programmable memories in any of the first to the sixth embodiments may not include any charge storage film as shown in FIG. 14. The transistor shown in FIG. 14 includes a source region 402 and a drain region 403 separated from each other in a semiconductor region 401, an insulating film 404 disposed in a channel region between the source region 402 and the drain region 403 on the semiconductor region 401, and a gate electrode 405 disposed on the insulating film 404. If the transistor is an n-channel transistor, the semiconductor region 401 is a p-type semiconductor region, and the source region 402 and the drain region 403 are n-type semiconductor regions.

If the transistor is a p-channel transistor, the semiconductor region 401 is an n-type semiconductor region, and the source region 402 and the drain region 403 are p-type semiconductor regions. Each of the insulating film 404 and the gate electrode 405 may be a single material film, or a multilayer film including films of a plurality of materials.

The transistor having the structure shown in FIG. 14 can be manufactured at a lower cost than the transistor having the structure shown in FIG. 13. Since the distance between the semiconductor region 401 and the gate electrode 405 is small, data can be written to this transistor with a lower write voltage. Generally, the distance between the semiconductor region 301 and the gate electrode 307 in the transistor having the structure shown in FIG. 13 is more than 10 nm. However, the distance between the semiconductor region 401 and the gate electrode 405 is less than 10 nm in the transistor having, the structure shown in FIG. 14.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor nonvolatile memory device comprising:
a plurality of transistors arranged in rows and columns to form a matrix, each transistor including a source region and a drain region separately disposed in a semiconductor region, and a gate disposed on the semiconductor region in a channel region between the source region and the drain region, the transistors in the same row being connected in series to form a transistor string having a first terminal and a second terminal;
a plurality of first wiring lines each corresponding to one of the columns, and being connected to the gates of the transistors of the corresponding column;
a common first electrode connected to each semiconductor region in which each transistor is disposed; and
a write circuit that selects one of the first wiring lines and one of the transistor strings, and applies a first voltage to the first electrode, a first write voltage to the selected first wiring line, a second voltage to the other first wiring lines, and a second write voltage to the first terminal and the second terminal of the selected transistor string in a write operation,
the first voltage being between the first write voltage and the second write voltage, and the second write voltage being between the first voltage and the second voltage,
wherein when the transistors are n-channel transistors,
the first write voltage, the first voltage, the second write voltage, and the second voltage meet the following relationship:
the first write voltage<the first voltage<the second write voltage<the second voltage, and
when the transistors are p-channel transistors, the first write voltage, the first voltage, the second write voltage, and the second voltage meet the following relationship:
the first write voltage>the first voltage>the second write voltage>the second voltage.

2. The device according to claim 1, wherein in the write operation, the write circuit applies the first voltage to the first terminal and the second terminal of each of the transistor strings that are not selected.

3. The device according to claim 1, wherein:
each of the transistors includes a first insulating film disposed on the channel region and the gate disposed on the first insulating film; and
a distance from a top surface of the channel region to a bottom of the gate is 10 nm or less.

4. The device according to claim 1, wherein
each of the transistors includes a first insulating film disposed on the channel region, a charge storage film disposed on the first insulating film, a second insulating film disposed on the charge storage film, and the gate disposed on the second insulating film.

5. A semiconductor nonvolatile memory device comprising:
a plurality of transistors arranged in rows and columns to form a matrix, each transistor including a source region and a drain region separately disposed in a semiconductor region, and a gate disposed on the semiconductor region in a channel region between the source region and the drain region, the transistors in the same row being connected in series to form a transistor string having a first terminal and a second terminal;
a plurality of first wiring lines each corresponding to one of the columns, and being connected to the gates of the transistors of the corresponding column;
a common first electrode connected to each semiconductor region in which each transistor is disposed;
a plurality of first select transistors and a plurality of second select transistors each corresponding to one of the transistor strings, one of a source and a drain of each first select transistor being connected to one of the first terminal and the second terminal of the corresponding transistor string, and one of a source and a drain of each second select transistor being connected to the other of the first terminal and the second terminal of the corresponding transistor string;
a second wiring line connected to a gate of each first select transistor;
a third wiring line connected to a gate of each second select transistor;
a fourth wiring line connected to the other of the source and the drain of each first select transistor;
a plurality of fifth wiring lines each corresponding to one of the rows and being connected to the other of the source and the drain of the second select transistor connected to the corresponding row; and
a write circuit that selects one of the first wiring lines and one of the transistor strings, applies a first voltage to the first electrode, a first write voltage to the selected first wiring line, and a second voltage to the first wiring lines that are not selected, turns off the first select transistors connected to the selected transistor string and turns on the second select transistors to apply a second write voltage to the first terminal or the second terminal of the selected transistor string via the second select transistors in a write operation,
the first voltage being between the first write voltage and the second write voltage, and the second write voltage being between the first voltage and the second voltage, wherein when the transistors are n-channel transistors,
the first write voltage, the first voltage, the second write voltage, and the second voltage meet the following relationship:
the first write voltage<the first voltage<the second write voltage<the second voltage, and
when the transistors are p-channel transistors, the first write voltage, the first voltage, the second write voltage, and the second voltage meet the following relationship:
the first write voltage>the first voltage>the second write voltage>the second voltage.

6. The device according to claim 5, wherein the write circuit applies the first voltage to the second wiring line and a third voltage to the third wiring line in the write operation, and the second write voltage is between the first voltage and the third voltage.

7. The device according to claim 5, wherein in the write operation, the write circuit applies the first voltage to the first terminal and the second terminal of each of the transistor strings that are not selected.

8. The device according to claim 5, wherein:
each of the transistors includes a first insulating film disposed on the channel region and the gate disposed on the first insulating film; and
a distance from a top surface of the channel region to a bottom of the gate is 10 nm or less.

9. The device according to claim 5, wherein
each of the transistors includes a first insulating film disposed on the channel region, a charge storage film disposed on the first insulating film, a second insulating film disposed on the charge storage film, and the gate disposed on the second insulating film.

10. A semiconductor nonvolatile memory device comprising:
a plurality of transistors arranged in rows and columns to form a matrix, each transistor including a source region and a drain region separately disposed in a semiconductor region, and a gate disposed on the semiconductor region in a channel region between the source region and the drain region, the transistors in the same row being connected in series to form a transistor string having a first terminal and a second terminal;
a plurality of first wiring lines each corresponding to one of the columns, and being connected to the gates of the transistors of the corresponding column;
a common first electrode connected to each semiconductor region in which each transistor is disposed;
a plurality of first select transistors and a plurality of second select transistors each corresponding to one of the transistor strings, one of a source and a drain of each first select transistor being connected to one of the first terminal and the second terminal of the corresponding transistor string, and one of a source and a drain of each second select transistor being connected to the other of the first terminal and the second terminal of the corresponding transistor string;
a second wiring line connected to a gate of each first select transistor;
a third wiring line connected to a gate of each second select transistor;
a fourth wiring line connected to the other of the source and the drain of each first select transistor;
a plurality of fifth wiring lines each corresponding to one of the rows and being connected to the other of the source and the drain of the second select transistor connected to the corresponding row; and
a write circuit that selects one of the transistor strings, applies a first voltage to the first electrode, a second voltage to the first wiring lines, turns off the first select transistor connected to the selected transistor string and turns on the second select transistor to apply a second write voltage to the first terminal or the second terminal of the selected transistor string via the second select transistor, selects one of the first wiring lines, and then applies a first write voltage to the selected first wiring line;
the first voltage being between the first write voltage and the second write voltage, and the second write voltage being between the first voltage and the second voltage,
wherein when the transistors are n-channel transistors,
the first write voltage, the first voltage, the second write voltage, and the second voltage meet the following relationship:
the first write voltage<the first voltage<the second write voltage<the second voltage,
and
when the transistors are p-channel transistors, the first write voltage, the first voltage, the second write voltage, and the second voltage meet the following relationship:
the first write voltage>the first voltage>the second write voltage>the second voltage.

11. The device according to claim 10, wherein the write circuit applies the first voltage to the second wiring line and a third voltage to the third wiring line in the write operation, and the second write voltage is between the first voltage and the third voltage.

12. The device according to claim 10, wherein in the write operation, the write circuit applies the first voltage to the first terminal and the second terminal of each of the transistor strings that are not selected.

13. The device according to claim 10, wherein:
each of the transistors includes a first insulating film disposed on the channel region and the gate disposed on the first insulating film; and
a distance from a top surface of the channel region to a bottom of the gate is 10 nm or less.

14. The device according to claim 10, wherein
each of the transistors includes a first insulating film disposed on the channel region, a charge storage film disposed on the first insulating film, a second insulating film disposed on the charge storage film, and the gate disposed on the second insulating film.

15. A semiconductor nonvolatile memory device comprising:
a plurality of transistors arranged in rows and columns to form a matrix, each transistor including a source region and a drain region separately disposed in a semiconductor region, and a gate disposed on the semiconductor region in a channel region between the source region and the drain region, the transistors in the same row being connected in series to form a transistor string having a first terminal and a second terminal;
a plurality of first wiring lines each corresponding to one of the columns, and being connected to the gates of the transistors of the corresponding column;
a common first electrode connected to each semiconductor region in which each transistor is disposed;
a plurality of first select transistors and a plurality of second select transistors each corresponding to one of the transistor strings, one of a source and a drain of each first select transistor being connected to one of the first terminal and the second terminal of the corresponding transistor string, and one of a source and a drain of each second select transistor being connected to the other of the first terminal and the second terminal of the corresponding transistor string;

a second wiring line connected to a gate of each first select transistor;

a third wiring line connected to a gate of each second select transistor;

a plurality of fourth wirings each corresponding to one of the rows, and connected to the other of the source and the drain of the first select transistor of the corresponding row;

a plurality of fifth wiring lines each corresponding to one of the rows and being connected to the other of the source and the drain of the second select transistor connected to the corresponding row; and a write circuit that selects one of the first wiring lines and one of the transistor strings, applies a first voltage to the first electrode, a first write voltage to the selected first wiring line, and a second voltage to the first wiring lines that are not selected, and turns on the first select transistor and the second select transistor connected to the selected transistor string to apply a second write voltage to the first terminal and the second terminal of the selected transistor string via the first select transistor and the second select transistor in a write operation, the first voltage being between the first write voltage and the second write voltage, and the second write voltage being between the first voltage and the second voltage, wherein when the transistors are n-channel transistors, the first write voltage, the first voltage, the second write voltage, and the second voltage meet the following relationship:

the first write voltage<the first voltage<the second write voltage<the second voltage, and when the transistors are p-channel transistors, the first write voltage, the first voltage, the second write voltage, and the second voltage meet the following relationship:

the first write voltage>the first voltage>the second write voltage>the second voltage.

16. The device according to claim 15, wherein the write circuit applies a third voltage to the second wiring line and the third wiring line in the write operation, and the second write voltage is between the first voltage and the third voltage.

17. The device according to claim 15, wherein in the write operation, the write circuit applies the first voltage to the first terminal and the second terminal of each of the transistor strings that are not selected.

18. The device according to claim 15, wherein:
each of the transistors includes a first insulating film disposed on the channel region and the gate disposed on the first insulating film; and
a distance from a top surface of the channel region to a bottom of the gate is 10 nm or less.

19. The device according to claim 15, wherein
each of the transistors includes a first insulating film disposed on the channel region, a charge storage film disposed on the first insulating film, a second insulating film disposed on the charge storage film, and the gate disposed on the second insulating film.

* * * * *